US008335115B2

United States Patent
Lee

(10) Patent No.: US 8,335,115 B2
(45) Date of Patent: *Dec. 18, 2012

(54) SEMICONDUCTOR MEMORY MODULE AND SEMICONDUCTOR MEMORY SYSTEM HAVING TERMINATION RESISTOR UNITS

(75) Inventor: Jung-bae Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 302 days.

This patent is subject to a terminal disclaimer.

(21) Appl. No.: 12/781,936

(22) Filed: May 18, 2010

(65) Prior Publication Data

US 2010/0226185 A1    Sep. 9, 2010

Related U.S. Application Data

(63) Continuation-in-part of application No. 12/539,840, filed on Aug. 12, 2009, now Pat. No. 7,996,590, which is a continuation-in-part of application No. 11/024,860, filed on Dec. 30, 2004, now Pat. No. 7,716,401.

(30) Foreign Application Priority Data

May 20, 2009    (KR) .................... 10-2009-0044135

(51) Int. Cl.
*G11C 7/10*    (2006.01)
(52) U.S. Cl. ................ 365/189.05; 365/51; 365/189.09; 710/100
(58) Field of Classification Search ............. 365/189.05, 365/51, 226, 189.09; 710/100
See application file for complete search history.

(56) References Cited

U.S. PATENT DOCUMENTS 5,815,446 A    9/1998    Tobita
6,115,316 A    9/2000    Mori et al.
(Continued)

FOREIGN PATENT DOCUMENTS

FR    2792760 A1    10/2000
(Continued)

OTHER PUBLICATIONS

Zheng, H., Lin, J., Zhang, Z. and Zhu, Z., "Decoupled DIMM: Building High-Bandwidth Memory System Using Low-Speed DRAM Devices", Proceedings of the 36th Annual International Symposium on Computer Architecture (Austin, TX, USA, Jun. 20-24, 2009). ISCA '09. ACM, New York, NY, pp. 255-266.

(Continued)

*Primary Examiner* — Huan Hoang
(74) *Attorney, Agent, or Firm* — Volentine & Whitt, PLLC

(57) ABSTRACT

A semiconductor memory module includes a memory module board having at least one semiconductor memory device, an advanced memory buffer (AMB) for receiving the data and the command/address signal from a host and providing the data and the command/address signal to the at least one semiconductor memory device, and a second termination resistor unit located on the memory module board and electrically connected to the AMB. The at least one semiconductor memory device includes a data input buffer for receiving data via a first input terminal and receiving a first reference voltage via a second input terminal, a command/address input buffer for receiving a command/address signal via a first input terminal and receiving a second reference voltage via a second input terminal, and a first termination resistor unit connected to the first input terminal of the data input buffer.

23 Claims, 28 Drawing Sheets

U.S. PATENT DOCUMENTS

| | | | |
|---|---|---|---|
| 6,125,419 | A | 9/2000 | Umemura et al. |
| 6,337,814 | B1 | 1/2002 | Tanida et al. |
| 6,356,106 | B1 | 3/2002 | Greeff et al. |
| 6,424,590 | B1 | 7/2002 | Taruishi et al. |
| 6,442,644 | B1 | 8/2002 | Gustavson et al. |
| 6,549,480 | B2 | 4/2003 | Hosogane et al. |
| 6,567,319 | B2 | 5/2003 | Sato et al. |
| 6,657,906 | B2 | 12/2003 | Martin |
| 6,667,928 | B2 | 12/2003 | Honma et al. |
| 6,707,724 | B2 | 3/2004 | Kim et al. |
| 6,738,844 | B2 | 5/2004 | Muljono et al. |
| 6,829,178 | B2 | 12/2004 | Koyama et al. |
| 6,882,570 | B2 | 4/2005 | Byeon et al. |
| 6,937,494 | B2 | 8/2005 | Funaba et al. |
| 6,963,218 | B1 | 11/2005 | Alexander et al. |
| 7,012,449 | B2 | 3/2006 | Lee et al. |
| 7,313,715 | B2 | 12/2007 | Yoo et al. |
| 7,716,401 | B2 * | 5/2010 | Lee .............................. 710/100 |
| 7,996,590 | B2 * | 8/2011 | Lee .............................. 710/100 |
| 2003/0058060 | A1 | 3/2003 | Yamamoto |
| 2003/0124989 | A1 | 7/2003 | Kwon |
| 2003/0197528 | A1 | 10/2003 | Shibata et al. |
| 2003/0206048 | A1 | 11/2003 | Toyoshima et al. |
| 2004/0170067 | A1 | 9/2004 | Kashiwazaki |
| 2005/0052912 | A1 | 3/2005 | Cogdill et al. |
| 2005/0253615 | A1 | 11/2005 | Sunwoo et al. |
| 2009/0003089 | A1 | 1/2009 | Do |
| 2009/0122634 | A1 | 5/2009 | Kang |

FOREIGN PATENT DOCUMENTS

| | | |
|---|---|---|
| JP | 2003133943 A | 5/2003 |
| JP | 2004312262 A | 11/2004 |
| JP | 2005065249 A | 3/2005 |
| JP | 2007179725 A | 7/2007 |
| JP | 2008017475 A | 1/2008 |
| KR | 20020066019 | 8/2002 |
| KR | 20020066381 | 8/2002 |
| KR | 20030066450 | 8/2009 |

OTHER PUBLICATIONS

Knight et al., "A Self-Terminating Low-Voltage Swing CMOS Output Driver", Apr. 1988, IEEE, IEEE Journal of Solid-State Circuits, vol. 23, No. 2, pp. 457-464.

Alghanim, A., Lees, Jr., Williams, T., Benedikt, J., Tasker, P.J., "Reduction of Electrical Baseband Memory Effect in High-Power LDMOS Devices Using Optimum Termination for IMD3 and IMD5 Using Active Load-Pull", Microwave Symposium Digest, 2008 IEEE MTT-S International, Vol., No. pp. 415-418, Jun. 15-20, 2008.

Chang, N., Kim, K., and Cho, J., "Bus Encoding for Low-Power High-Performance Memory Systems", Proceedings of the 37th Annual Design Automation Conference (Los Angeles, California, United States, Jun. 5-9, 2000). DAC '00. ACM, New York, NY, pp. 800-805.

* cited by examiner (a)                  (b)

SEMICONDUCTOR MEMORY MODULE AND SEMICONDUCTOR MEMORY SYSTEM HAVING TERMINATION RESISTOR UNITS

RELATED APPLICATIONS

A claim of priority is made to Korean Patent Application No. 10-2009-0044135, filed on May 20, 2009, in the Korean Intellectual Property Office, the subject matter of which is hereby incorporated by reference. In addition, this application is a continuation-in-part of Ser. No. 12/539,840 filed Aug. 12, 2009, which is a continuation-in-part of U.S. patent application Ser. No. 11/024,860, filed Dec. 30, 2004, the subject matters of which are hereby incorporated by reference.

BACKGROUND

Embodiments of the inventive concept relate to a memory module and a semiconductor memory system, and more particularly, to a memory module and a semiconductor memory system capable of improving signal integrity.

Semiconductor memory devices used in electronic systems have been developed with increased capacity and operating speeds. Dynamic random access memory (DRAM), for example, has come into widespread use in computer systems, such as personal computers (PCs) or servers. In order to increase the performance and capacity of a semiconductor memory device, multiple semiconductor memories are mounted in a memory module, which is installed in a computer system.

Examples of DRAM include synchronous semiconductor memory devices, e.g., synchronous dynamic random access memory (SDRAM), which operate in synchronization with a system clock signal. Examples of SDRAM include double-data-rate (DDR) SDRAM that delivers data in synchronization with rising and falling edges of a system clock signal. DDR SDRAM has evolved into DDR2 SDRAM, DDR3 SDRAM, etc., the performances of which are respectively improved in terms of operating speeds. Such semiconductor memory devices have different operating characteristics, and thus, a memory system needs a memory controller suitable for each semiconductor memory device.

FIG. 1 is a block diagram of a semiconductor memory system 100. Referring to FIG. 1, the semiconductor memory system 100 includes memory controller 110 and memory module 120. Although FIG. 1 illustrates that the semiconductor memory system 100 has one memory module for convenience of explanation, two or more memory modules may be included in the semiconductor memory system 100.

Signals are exchanged between the memory controller 110 and the memory module 120 via various system buses included in the semiconductor memory system 100. For example, the memory controller 110 transmits write data to the memory module 120 or receives read data from the memory module 120 via data bus DQBUS. The memory controller 110 transmits command/address signals to the memory module 120 via command/address bus CABUS. In order to prevent such signals from becoming distorted due to impedance mismatching, multiple termination resistors RT11 and RT12 may be respectively connected to ends of the data bus DQBUS and the command/address bus CABUS. The memory controller 110, the memory module 120 and the termination resistors RT11 and RT12 are disposed on a motherboard in the semiconductor memory system 100.

At least one semiconductor memory device may be mounted in the memory module 120. For example, first through nth semiconductor memory devices DRAM1 to DRAMn may be mounted in the memory module 120. Each of the first through nth semiconductor memory devices DRAM1 to DRAMn may include data output buffer 121, data input buffer 122 and command/address input buffer 123. Also, the memory module 120 may further include command/address buffer 124 that temporarily stores the command/address signal received from the memory controller 110. The command/address buffer 124 is commonly used by the first through nth semiconductor memory devices DRAM1 to DRAMn, and buffers the command/address signals received from the memory controller 110 and provides a result of the buffering to the first through nth semiconductor memory devices DRAM1 to DRAMn.

In general, pseudo-differential signaling may be used to receive data or a command/address signal from DDR SDRAM. According to pseudo-differential signaling, the data input buffer 122 receives input data and a reference voltage VrefDQ for data, and generates internal input data DIN by amplifying a voltage difference between the input data and the reference voltage VrefDQ. Also, the command/address input buffer 123 receives the command/address signal and a reference voltage VrefCA for a command/address signal, and generates an internal command/address signal CAI by amplifying a voltage difference between the input data and the reference voltage VrefCA. The memory controller 110 may provide the input data and the command/address signal via a system bus.

The reference voltage VrefDQ for data and the reference voltage VrefCA for a command/address may be applied by the memory controller 110 or may be generated from a predetermined power supply voltage in the memory module 120. If these reference voltages are applied via a system bus, noise may occur in the reference voltage VrefCA applied to the command/address input buffer 124 when the data output buffer 121, for example, operates. In order to reduce such noise, a bus for transmitting the reference voltage VrefDQ for data (e.g., Vref DQBUS) and a bus for transmitting the reference voltage VrefCA for a command/address (e.g., Vref CABUS) are separately provided.

DDR semiconductor memory devices, such as DDR2 SDRAM and DDR3 SDRAM, have been developed for increasing operating speeds and decreasing driving voltages. To secure the integrity of signals exchanged between the memory controller 110 and the memory module 120 in the memory system 100, a termination device is generally used. Conventionally, a general termination resistor is connected to a system bus, such as the data bus DQBUS or the command/address bus CABUS, on a motherboard or an additional termination resistor (not shown) is simply disposed in a semiconductor memory device. The termination device is disposed regardless of the reference voltage VrefDQ for data, which is applied to the data input buffer 122, and regardless of the reference voltage VrefCA for a command/address signal, which is applied to the command/address input buffer 124. Such a conventional method may be applied to DDR3 SDRAM and a semiconductor memory system which is developed prior to DDR3 SDRAM, in terms of signal integrity.

However, for memory systems employing semiconductor memory devices developed after DDR3 SDRAM, for example, the data transmission rate is higher and a driving voltage is lower than DDR3 SDRAM. Thus, securing signal integrity is limited simply using such a conventional method. Therefore, there is a growing need to develop a method of securing signal integrity for a memory system using semiconductor memory devices developed after development of DDR3 SDRAM.

SUMMARY

According to an aspect of the inventive concept, there is provided a semiconductor memory module including a memory module board having at least one semiconductor memory device, an advanced memory buffer (AMB) for receiving the data and the command/address signal from a host and providing data and a command/address signal to the at least one semiconductor memory device, and a second termination resistor unit located on the memory module board and electrically connected to the AMB. The at least one semiconductor memory device includes a data input buffer for receiving the data via a first input terminal and receiving a first reference voltage via a second input terminal, a command/address input buffer for receiving the command/address signal via a first input terminal and receiving a second reference voltage via a second input terminal, and a first termination resistor unit connected to the first input terminal of the data input buffer. The first termination resistor unit includes a first resistor connected between a first voltage source and the first input terminal of the data input buffer, the first termination resistor unit for applying a first voltage from the first voltage source to the first input terminal of the data input buffer. The second termination resistor unit includes a second resistor connected between a second voltage source and the first input terminal of the command/address input buffer, and a third resistor connected between a third voltage source and the first input terminal of the command/address input buffer.

According to another aspect of the inventive concept, there is provided a semiconductor memory module including a memory module board having at least one semiconductor memory device including multiple memory ranks, a logic element for receiving information from a host and generating a control signal for controlling a selection of the multiple memory ranks, a register for receiving data and a command/address signal from the host and providing the data and the command/address signal to the at least one semiconductor memory device, and a second termination resistor unit located on the memory module board and electrically connected to the register. The at least one semiconductor memory device includes a data input buffer for receiving the data via a first input terminal and receiving a first reference voltage via a second input terminal, a command/address input buffer for receiving the command/address signal via a first input terminal and receiving a second reference voltage via a second input terminal, and a first termination resistor unit connected to the first input terminal of the data input buffer. The first termination resistor unit includes a first resistor connected between a first voltage source and the first input terminal of the data input buffer, the first termination resistor unit for applying a first voltage from the first voltage source to the first input terminal of the data input buffer. The second termination resistor unit includes a second resistor connected between a second voltage source and the first input terminal of the command/address input buffer, and a third resistor connected between a third voltage source and the first input terminal of the command/address input buffer.

According to another aspect of the inventive concept, there is provided a semiconductor memory module including a memory module board having at least two semiconductor memory devices, an AMB for receiving data and a command/address signal from a host and providing the data and the command/address signal to the at least one semiconductor memory device, and a second termination resistor unit located on the memory module board and electrically connected to the AMB. Each of the at least two semiconductor memory devices includes a data input buffer for receiving the data via a first input terminal and receiving a first reference voltage via a second input terminal, a command/address input buffer for receiving the command/address signal via a first input terminal and receiving a second reference voltage via a second input terminal, and a first termination resistor unit connected to the first input terminal of the data input buffer. The first termination resistor unit includes a first resistor connected between a first voltage source and the first input terminal of the data input buffer, the first termination resistor unit for applying a first voltage from the first voltage source to the first input terminal of the data input buffer. The second termination resistor unit includes a second resistor connected between a second voltage source and the first input terminal of the command/address input buffer, the second resistor for applying a second voltage from the second voltage source to the first input terminal of the command/address input buffer.

According to another aspect of the inventive concept, there is provided a semiconductor memory module including a memory module board having at least two semiconductor memory devices with multiple memory ranks, a logic element for receiving information from a host and generating a control signal for controlling a selection of the multiple memory ranks, a register for receiving the data and the command/address signal from the host and providing data and a command/address signal to the at least two semiconductor memory devices, and a second termination resistor unit located on the memory module board and electrically connected to the register. Each of the at least two semiconductor memory devices includes a data input buffer for receiving the data via a first input terminal and receiving a first reference voltage via a second input terminal, a command/address input buffer for receiving the command/address signal via a first input terminal and receiving a second reference voltage via a second input terminal, and a first termination resistor unit connected to the first input terminal of the data input buffer. The first termination resistor unit includes a first resistor connected between a first voltage source and the first input terminal of the data input buffer, the first termination resistor unit for applying a first voltage from the first voltage source to the first input terminal of the data input buffer. The second termination resistor unit includes a second resistor connected between a second voltage source and the first input terminal of the command/address input buffer, the second resistor for applying a second voltage from the second voltage source to the first input terminal of the command/address input buffer.

According to another aspect of the inventive concept, there is provided a semiconductor memory module including a memory module board having at least one semiconductor memory device; at least one command/address bus, each of the at least one command/address bus receiving a command/address signal from a host and providing the command/address signal to the corresponding semiconductor memory device; and at least one second termination resistor unit located on the memory module board, each of the at least one second termination resistor unit connected to the corresponding command/address bus. The at least one semiconductor memory device includes a data input buffer for receiving data via a first input terminal and receiving a first reference voltage via a second input terminal, a command/address input buffer for receiving the command/address signal via a first input terminal and receiving a second reference voltage via a second input terminal, and a first termination resistor unit connected to the first input terminal of the data input buffer. The first termination resistor unit includes a first resistor connected between a first voltage source and the first input terminal of the data input buffer, the first termination resistor unit for applying a first voltage from the first voltage source to the first input terminal of the data input buffer. The second termination resistor unit includes a second resistor connected between a second voltage source and the first input terminal of the command/address input buffer, and a third resistor connected between a third voltage source and the first input terminal of the command/address input buffer.

BRIEF DESCRIPTION OF THE DRAWINGS

Exemplary embodiments of the inventive concept will be described with reference to the attached drawings, in which.

DETAILED DESCRIPTION OF THE EMBODIMENTS

Figure 1:
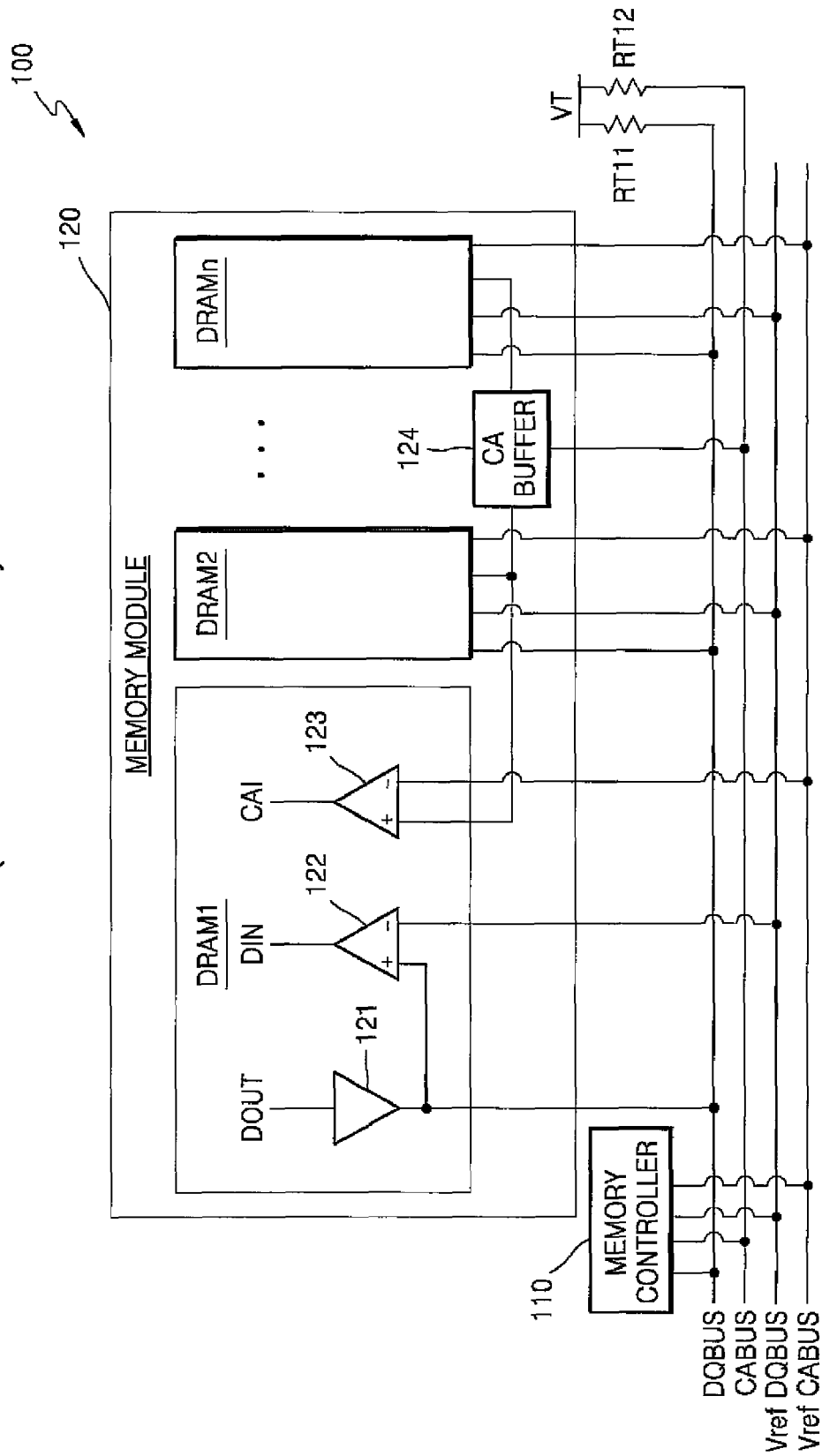
FIG. 1 is a block diagram of a conventional semiconductor memory system.

The present inventive concept will now be described more fully with reference to the accompanying drawings, in which exemplary embodiments of the inventive concept are shown. The inventive concept, however, may be embodied in various different forms, and should not be construed as being limited only to the illustrated embodiments. Rather, these embodiments are provided as examples, to convey the concept of the inventive concept to one skilled in the art. Accordingly, known processes, elements, and techniques are not described with respect to some of the embodiments of the inventive concept. Throughout the drawings and written description, like reference numerals will be used to refer to like or similar elements.

Figure 2:
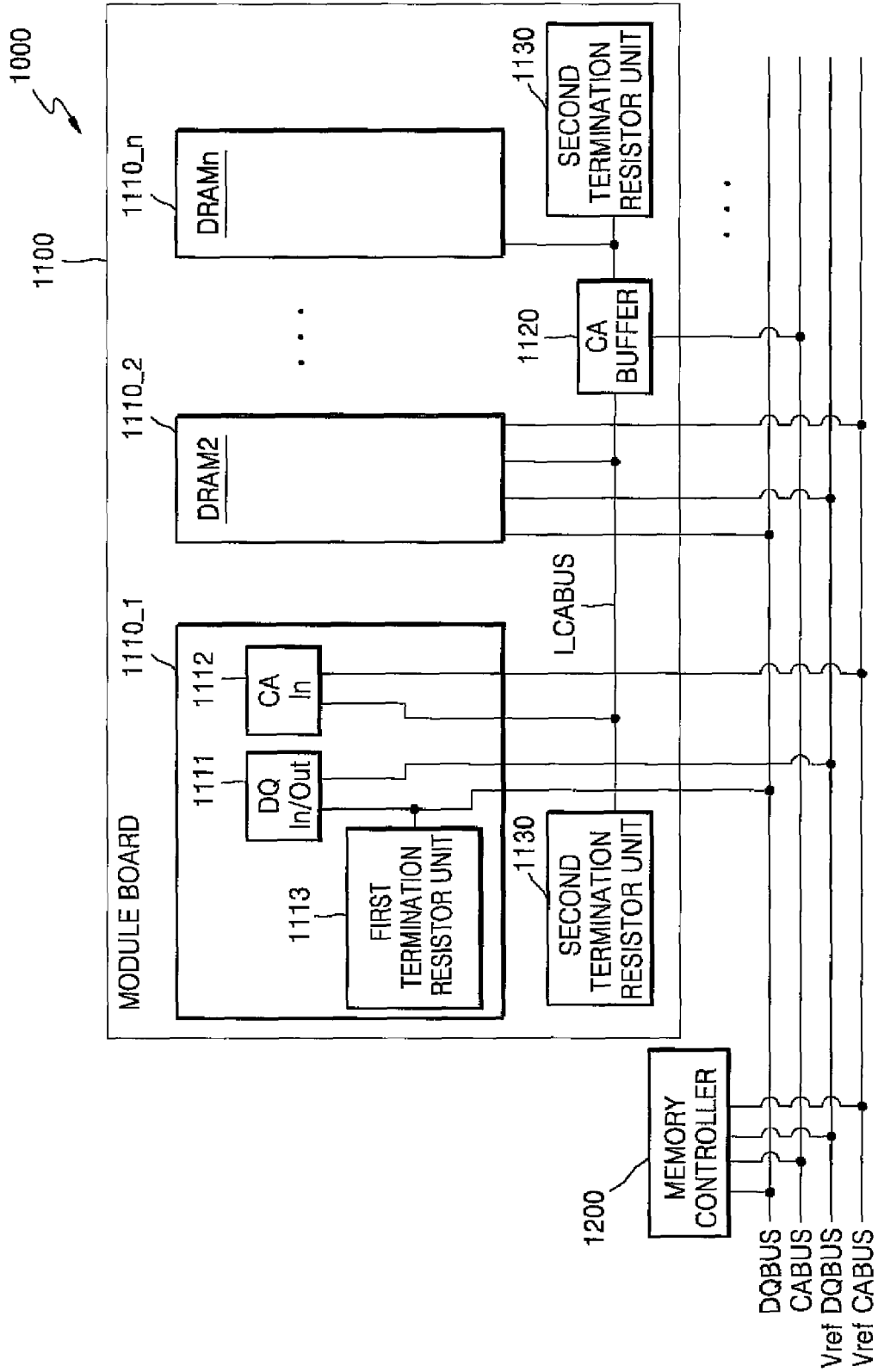
FIG. 2 is a block diagram of a semiconductor memory system, according to an illustrative embodiment.

FIG. 2 is a block diagram of a semiconductor memory system according to an illustrative embodiment. Referring to FIG. 2, the semiconductor memory system 1000 includes memory module 1100 in which at least one semiconductor memory device, e.g., semiconductor memory devices 1110_1 to 1110_n, are included, and a memory controller 1200 that communicates data and a command/address signal with the memory module 1100. The semiconductor memory system 1000 further includes system buses, such as data bus DQBUS and command/address bus CABUS. Also, as illustrated in FIG. 2, when the memory module 1100 receives at least one reference voltage from the memory controller 1200, the system buses may further include reference voltage bus VrefDQBUS for data (hereinafter referred to as "first system bus") and reference voltage bus VrefCABUS for command/address signals (hereinafter referred to as "second system bus"). Although not shown in the drawings, a reference voltage VrefDQ for data and a reference voltage VrefCA for a command/address signal may be generated from a predetermined power supply voltage in the memory module 1100 (or in the semiconductor memory devices 1110_1 to 1110_n).

The memory module 1100 includes at least one semiconductor memory device, e.g., the n semiconductor memory devices 1110_1 to 1110_n. Each of the semiconductor memory devices 1110_1 to 1110_n may include synchronous dynamic random access memory (SDRAM) as memory for storing data. Also, each of the semiconductor memory devices 1110_1 to 1110_n includes data input/output buffer DQ In/Out 1111 through which data is input or output, command/address input buffer CA In 1112 through which a command/address signal is received, and first termination resistor unit 1113 connected to the data input/output buffer DQ In/Out 1111. Although not shown in FIG. 2, each of the second to nth semiconductor memory devices 1110_2 to 1110_n also include a data input/output buffer, a command/address input buffer and a first termination resistor unit, as discussed with reference to the first semiconductor memory device 1110_1.

The memory module 1100 further includes command/address buffer 1120 connected to the command/address bus CABUS. The command/address buffer 1120 temporarily stores a command/address signal received from the memory controller 1200, and provides the command/address signal to the semiconductor memory devices 1110_1 to 1110_n. The command/address buffer 1120 provides the command/address signal to the semiconductor memory devices 1110_1 to 1110_n via internal command/address bus I_CABUS included in the memory module 1100. The memory module 1100 further includes at least one second termination resistor unit 1130 connected to the internal command/address bus I_CABUS. For example, the memory module 1100 may include two second termination resistor units 1130 respectively connected to both ends of the internal command/address bus I_CABUS.

Termination devices may be installed in a semiconductor memory device to prevent deterioration of and otherwise improve the integrity of data and/or command/address signals. Also, when data and command/address signals are communicated using pseudo-differential signaling, the first system bus Vref DQBUS and the second system bus Vref CABUS have been separately provided in order to reduce noise occurring in reference voltage VrefDQ for data and/or reference voltage VrefCA for command/address signals, which are provided via a system bus. However, it is difficult for conventional systems to guarantee signal integrity by applying such methods to DRAM developed after development of DDR3 SDRAM, and which has operating speeds higher than DDR3 SDRAM and driving voltages lower than DDR3 SDRAM.

The relationship between a termination device included in a memory module, and reference voltages for data and command/address signals, according to an embodiment, will be described with reference to FIG. 3. The depicted embodiment improves characteristics of a signal communicated between a memory controller and a memory module in high speed DRAM, for example, developed after development of DDR3.

Figure 3:
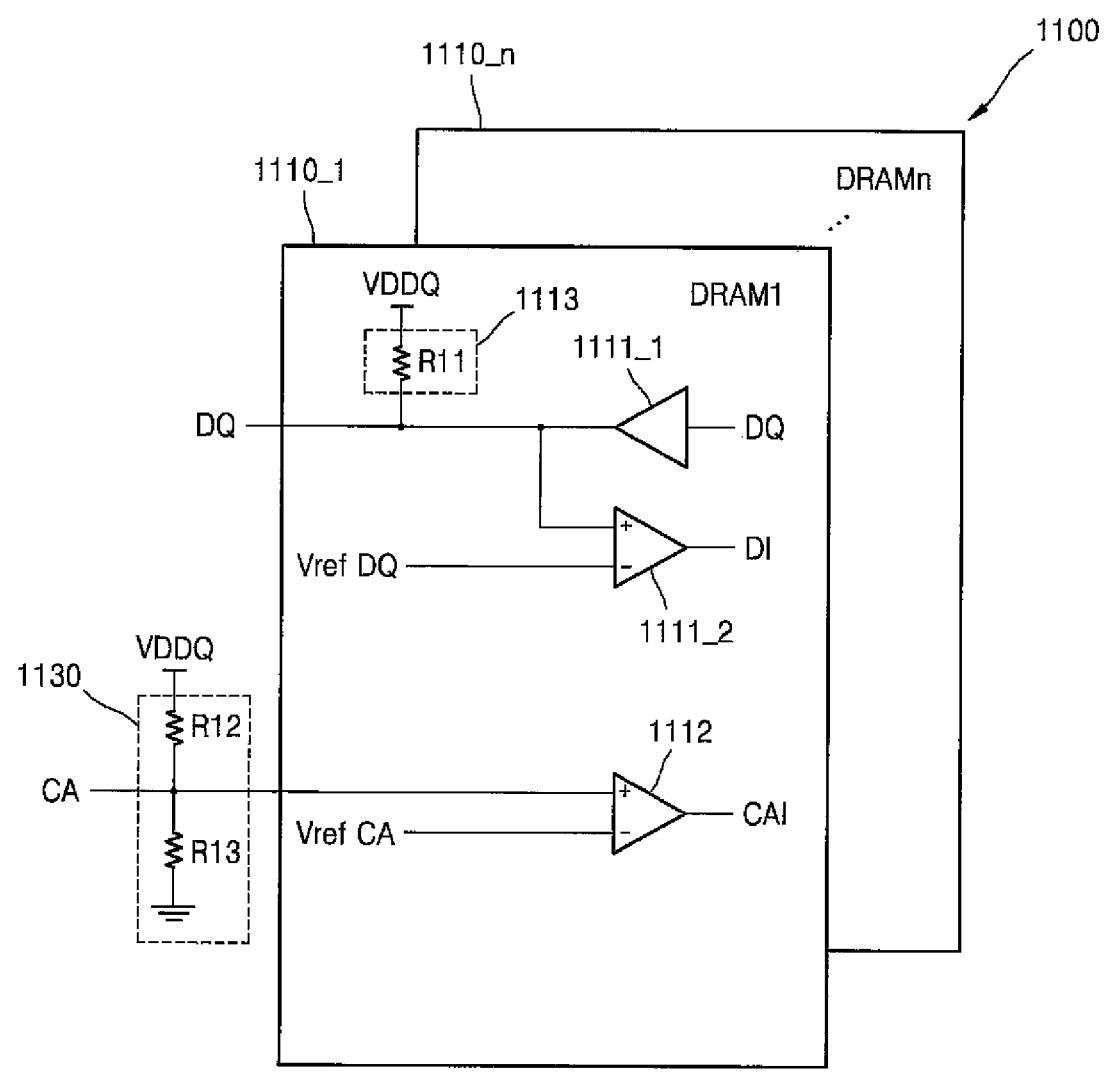
FIG. 3 is a circuit diagram of a semiconductor memory module, according to an illustrative embodiment.

FIG. 3 is a circuit diagram of a semiconductor memory module of semiconductor memory system 1000, according to an illustrative embodiment. Referring to FIG. 3, the memory module 1100 includes at least one semiconductor memory device, e.g., semiconductor memory devices 1110_1 to 1110_n, and a second termination resistor unit 1130 that is connected to an internal command/address bus for delivering a command/address signal CA in the memory module 1100. The configurations of the semiconductor memory devices 1110_1 to 1110_n will be described with respect to the first semiconductor memory device 1110_1, as an example.

The first semiconductor memory device 1110_1 includes data output buffer 1111_1, data input buffer 1111_2 and command/address input buffer 1112. The data output buffer 1111_1 buffers data DO read from the first semiconductor memory device 1110_1 and outputs the buffering result to the outside via an output terminal. The data input buffer 1111_2 receives external data DQ via a first input terminal and reference voltage VrefDQ for data (hereinafter referred to as "first reference voltage") via a second input terminal, and generates internal data DI using differential signaling. The output terminal of the data output buffer 1111_1 is connected to the first input terminal of the data input buffer 1111_2. The command/address input buffer 1112 receives the command/address signal CA from a command/address buffer (not shown) included in the memory module 1100 via a first input terminal and reference voltage VrefCA for a command/address (hereinafter referred to as "second reference voltage") via the second input terminal, and generates an internal command/address signal CAI using differential signaling.

In order to receive the command/address signal CA, a registered dual in-line memory module (RDIMM) as illustrated in FIG. 2 includes the command/address buffer 1120, and buffers the command/address signal CA via the command/address buffer 1120. However, in the case of an unbuffered dual in-line memory module (UDIMM), the command/address signal CA is provided to multiple semiconductor memory devices using a fly-by structure and a serial communication method. Also, the first reference voltage VrefDQ and the second reference voltage VrefCA may either be provided from the memory controller 1200 via a system bus or be generated from a power supply voltage by a reference voltage generator (not shown) included in the memory module 1100 (or in the first semiconductor memory device 1110_1.

The first semiconductor memory device 1110_1 further includes first termination resistor unit 1113, which is connected to the first input terminal of the data input buffer 1111_2. The second termination resistor unit 1130 is positioned outside the first semiconductor memory device 1110_1 and within the memory module 1100. The second termination resistor unit 1130 is connected to the first input terminal of the command/address input buffer 1112.

The first termination resistor unit 1113 and the second termination resistor unit 1130 are different types of termination devices having different resistor constructions, respectively. For example, the first termination resistor unit 1113 may employ parallel termination, and may include a first resistor R11 connected between a power supply voltage VDDQ source and the first input terminal of the data input buffer 1111_2. Although only the first resistor R11 is illustrated in FIG. 3, the first termination resistor unit 1113 may include multiple resistors connected in parallel between the power supply voltage VDDQ source and the first input terminal of the data input buffer 1111_2.

The second termination resistor unit 1130 may employ center tap termination (CTT), for example, and may include a second resistor R12 connected between another power supply voltage VDDQ source and the first input terminal of the command/address input buffer 1112 and a third resistor R3 connected between the first input terminal of the command/address input buffer 1112 and a ground voltage GND source. The second and third resistors R12 and R13 may have the same resistance value, for example. In various embodiments, the power supply voltage VDDQ applied to the first resistor R11 may be equal to or different from the power supply voltage VDDQ applied to the second resistor R12.

The semiconductor memory devices 1110_1 to 1110_n respectively receive data via different buses. The first termination resistor unit 1113 is embodied as an on-die termination (ODT) device in each of the semiconductor memory devices 1110_1 to 1110_n. The semiconductor memory devices 1110_1 to 1110_n receive the command/address signal CA via a common internal command/address bus. The second termination resistor unit 1130 may be located outside the semiconductor memory devices 1110_1 to 1110_n.

The first input terminal of the data input buffer 1111_2 is precharged to the power supply voltage VDDQ by the first termination resistor unit 1113 and thus is capable of reducing power consumption in the first termination resistor unit 1113. Different buses, each connecting a semiconductor memory device and a system bus, through which data is provided, are respectively allocated to the semiconductor memory devices 1110_1 to 1110_n. Thus, the lengths of the different buses that respectively deliver data from the system buses to the semiconductor memory devices 1110_1 to 1110_n are similar to one another. Accordingly, the first input terminals of the data input buffers 1111_2 of the respective semiconductor memory devices 1110_1 to 1110_n have similar signal swing characteristics.

Since the type of the first termination resistor unit 1113 for inputting data is different from that of the second termination resistor unit 1130 for inputting the command/address signal CA, the first input terminals of the data input buffer 1111_2 and the command/address input buffer 1112 have different signal swing characteristics. That is, the first input terminal of the data input buffer 1111_2 has signal swing characteristics corresponding to the arrangement of resistors in the first termination resistor unit 1113, and the first input terminal of the command/address input buffer 1112 has signal swing characteristics corresponding to the arrangement of resistors in the second termination resistor unit 1130. The first reference voltage VrefDQ and the second reference voltage VrefCA applied to the memory module 1100 are determined to have different levels according to this difference in the signal swing characteristics. The first reference voltage VrefDQ has a first voltage level corresponding to a signal swing level of the first input terminal of the data input buffer 1111_2, and the second reference voltage VrefCA has a second voltage level corresponding to a signal swing level of the first input terminal of the command/address input buffer 1112.

The signal swing characteristics of the first input terminal of the data input buffer 1111_2 and the first input terminal of the command/address input buffer 1112, when the same power supply voltage VDDQ is applied to the first resistor R11 and the second resistor R12, will now be described.

When the first termination resistor unit 1113 employs parallel termination, the first input terminal of the data input buffer 1111_2 is precharged to the power supply voltage VDDQ in a standby state of the semiconductor memory devices 1110_1 to 1110_n, and the first input terminal of the data input buffer 1111_2 has a signal swinging level ranging between a high level and a low level according to input data. The high level corresponds to the power supply voltage VDDQ and the low level corresponds to a voltage between the ground voltage GND and a voltage VDDQ/2 that is half the power supply voltage VDDQ. When the second termination resistor unit 1130 employs CTT, the first input terminal of the command/address input buffer 1112 has a signal swing level having a shape symmetric with respect to the voltage VDDQ/2 in the vertical direction.

As described above, the signal swing level of the first input terminal of the data input buffer 1111_2 is greater than that of the first input terminal of the command/address input buffer 1112. Thus, the first reference voltage VrefDQ applied to the second input terminal of the data input buffer 1111_2 is determined to be a value between the power supply voltage VDDQ and the second reference voltage VrefCA. For example, if an ON-resistance value of a data driving driver is R and a resistance value of the first resistor R11 is 2×R, the low level has a value corresponding to VDDQ/3. In this case, the first reference voltage VrefDQ is determined to be approximately 2×VDDQ/3. If the resistance value of the first resistor R11 is not 2×R, the first reference voltage VrefDQ may be determined to be a value other than 2×VDDQ/3.

As described above, the second termination resistor unit 1130 connected to the first input terminal of the command/address input buffer 1112 employs CTT, and thus, the signal swing characteristics of the first input terminal of the command/address input buffer 1112 has a shape symmetrical with respect to the voltage VDDQ/2. The command/address buffer 1120 transmits the command/address signal CA via the internal command/address bus, and thus, a load on a semiconductor memory device that is physically distant from the command/address buffer 1120 is relatively high. However, as described above, since a signal output from the first input terminal of the command/address input buffer 1112 has swing characteristics showing a shape symmetrical with respect to the voltage VDDQ/2, it is possible to reduce problems caused by the difference between loads on the semiconductor memory devices 1110_1 to 1110_n.

Figure 4:
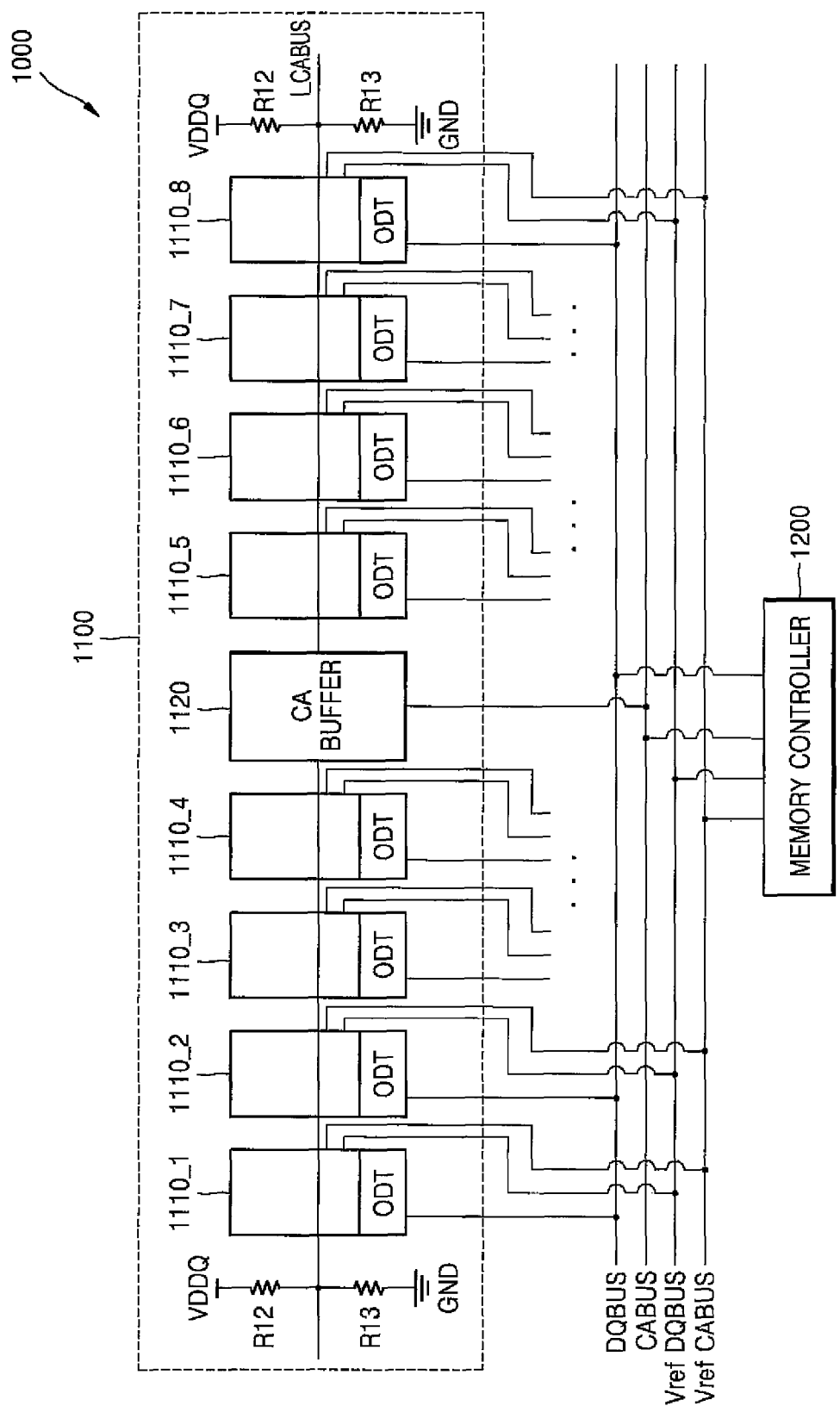
FIG. 4 is a block diagram of a semiconductor memory system using termination resistor units, such as shown in FIG. 3, according to an illustrative embodiment.

FIG. 4 is a schematic block diagram of a semiconductor memory system using termination resistor units, as shown in FIG. 3, for example, according to an illustrative embodiment. Referring to FIG. 4, a memory module 1100 includes at least one semiconductor memory device, e.g., eight semiconductor memory devices 1110_1 to 1110_8, a command/address buffer 1120, and multiple second termination resistor units R12 and R13. Each of the semiconductor memory devices 1110_1 to 1110_8 includes a first termination resistor unit which is an ODT device. The first termination resistor unit (ODT device) is connected to a data bus DQBUS, and performs termination on data supplied to the respective semiconductor memory devices 1110_1 to 1110_8. The second termination resistor units R12 and R13 may be connected to at least one node of an internal command/address bus on the memory module 1100. FIG. 4 illustrates the second termination resistor units R12 and R13 as being connected to, for example, both ends of the internal command/address bus I_CABUS.

Figure 5:
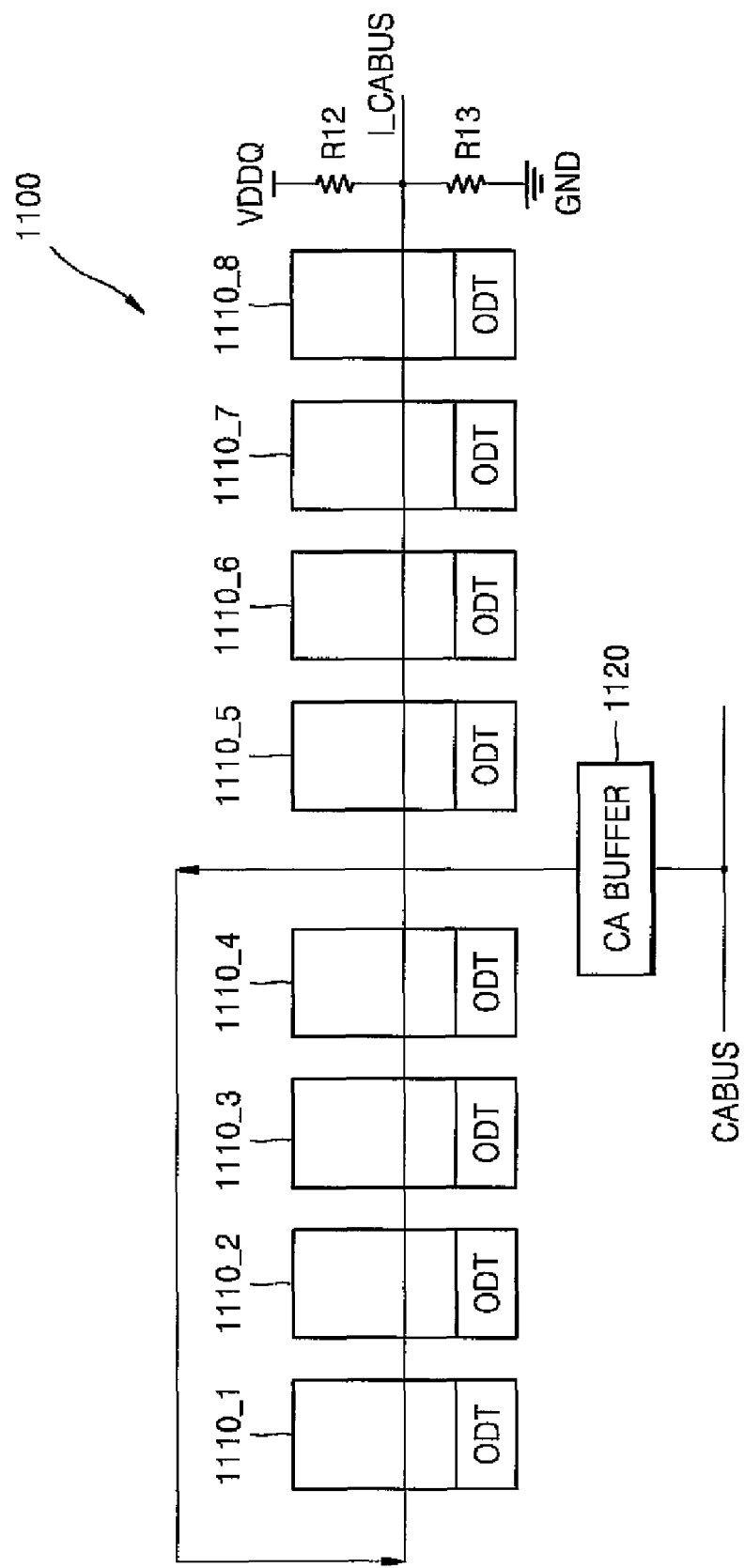
FIG. 5 is a block diagram of a memory module including an internal command/address bus having a fly-by daisy chain topology, according to an illustrative embodiment.

FIG. 5 is a block diagram of a memory module 1100 employing an internal command/address bus I_CABUS having a fly-by daisy chain topology, according to an illustrative embodiment. Referring to FIG. 5, the internal command/address bus I_CABUS delivers a command/address signal from one side of the memory module 1100 to the other side. Thus, at least one semiconductor memory device, e.g., first to eighth semiconductor memory devices 1110_1 to 1110_8, which is included in the memory module 1100, is allocated buses for receiving a command/address signal (the lengths of the buses are different from one another), thereby causing a difference between loads on the first to eighth semiconductor memory devices 1110_1 to 1110_8. However, as described above, the internal command/address bus I_CABUS is connected to a termination resistor unit, which may be an ODT device that employs CTT, for example, thereby reducing problems caused by the load difference.

Figure 6A:
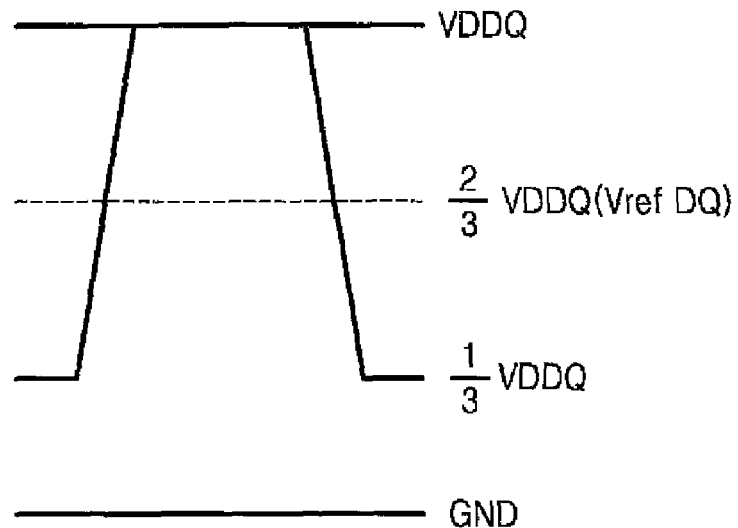
FIGS. 6A and 6B are graphs respectively illustrating signal swing characteristics of data and command/address input buffers, according to an illustrative embodiment.
Figure 6B:
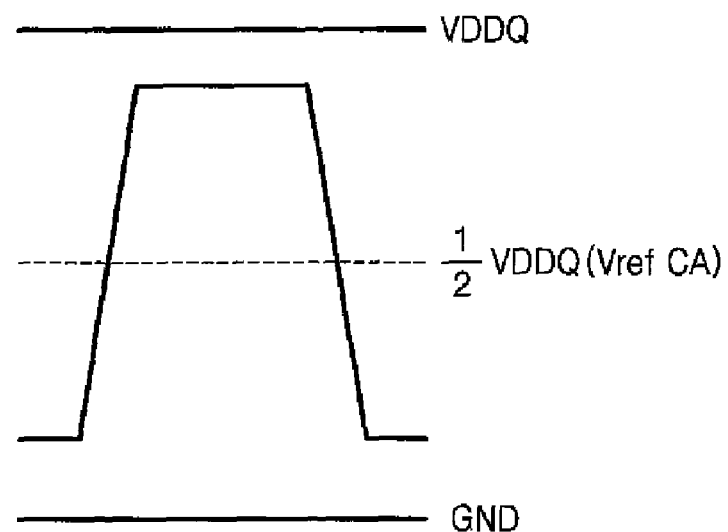

FIGS. 6A and 6B are graphs respectively illustrating signal swing characteristics of a data input buffer and a command/address input buffer according to an illustrative embodiment. In detail, FIG. 6A illustrates the signal swing characteristics of a first input terminal of the data input buffer and FIG. 6B illustrates the signal swing characteristics of a first input terminal of the command/address input buffer.

Referring to FIGS. 3 and 6A, when the first termination resistor unit 1113 employs parallel termination, in which a power supply voltage VDDQ is applied to the first termination resistor unit 1113, an ON-resistance value of a data driving driver is R and a resistance value of the first resistor R11 is 2×R, then the first input terminal of the data input buffer 1111_2 has signal swing characteristics ranging from a high level corresponding to the power supply voltage VDDQ to a low level corresponding to VDDQ/3. The low level may vary according to a resistance value of the first termination resistor unit 1113, and may have a level between VDDQ/2 and a ground voltage GND. In this case, a first reference voltage VrefDQ is determined to be either a value between the power supply voltage VDDQ and VDDQ/2 or a value between the power supply voltage VDDQ and a second reference voltage VrefCA.

Referring to FIGS. 3 and 6B, when the second termination resistor unit 1130 employs CTT in which resistors connected in series between a power supply voltage VDDQ source and a ground voltage GND source are included, the first input terminal of the command/address input buffer 1112 shows signal swing characteristics having a high level and a low level that are symmetrical with respect to a voltage VDDQ/2. Since the signal swing characteristics are based on the voltage VDDQ/2, a second reference voltage VrefCA for receiving a command/address signal may be equal to VDDQ/2.

As described above, the first reference voltage VrefDQ and the second reference voltage VrefCA may be generated by the memory controller 1200 and provided to the semiconductor memory devices 1100_1 to 1100_*n* in the memory module 1100. Alternatively, the first reference voltage VrefDQ and the second reference voltage VrefCA may be generated from a predetermined voltage by a voltage adjustment unit (not shown) included in the memory module 1100 (or the semiconductor memory devices 1100_1 to 1100_*n*). The first and second reference voltages VrefDQ and VrefCA may be generated by performing calibration based on the types of the first and second termination resistor units 1113 and 1130. For example, when the first termination resistor unit 1113 is a parallel termination type resistor, signal swing levels of the first input terminals of the data input buffers 1111_2 of the semiconductor memory devices 1100_1 to 1100_*n* may be slightly different from one another. Thus, a first reference voltage VrefDQ for each of the semiconductor memory devices 1100_1 to 1100_*n* may be generated by performing calibration. In this case, the first reference voltage VrefDQ used by each of the semiconductor memory devices 1100_1 to 1100_*n* may be different from one another. However, when the second termination resistor unit 1130 is a parallel termination type resistor, signal swing levels of the first input terminals of the command/address input buffers 1112 of the respective semiconductor memory devices 1100_1 to 1100_*n* may be slightly different from one another. Accordingly, the second reference voltage VrefCA may be generated by performing calibration.

Figure 7A:
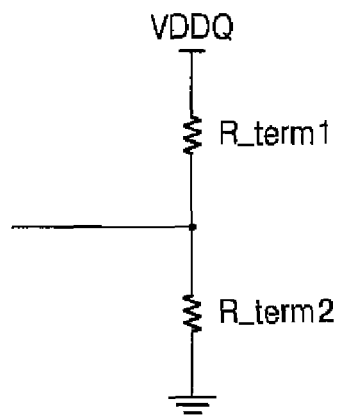
FIGS. 7A to 7C are circuit diagrams of representative termination resistor units, according to illustrative embodiments.
Figure 7B:
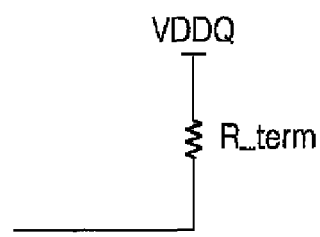
Figure 7C:
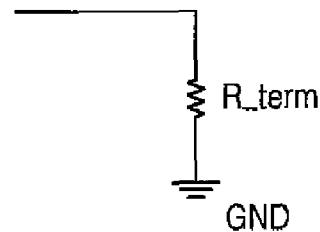

FIGS. 7A to 7C are circuit diagrams showing various configurations of termination resistor units, according to illustrative embodiments. FIG. 7A illustrates an example of a termination resistor unit that employs CTT. The termination resistor unit of FIG. 7A includes at least two resistors R_term1 and R_term2 connected between a power supply voltage VDDQ source and a ground voltage GND source.

FIG. 7B illustrates an example of a termination resistor unit that employs parallel termination. The termination resistor unit of FIG. 7B includes resistor R_term connected between a power supply voltage VDDQ source, and either a first input terminal of a data input buffer or a first input terminal of a command/address input buffer. FIG. 7C illustrates another example of a termination resistor unit that employs parallel termination. The termination resistor unit of FIG. 7C includes resistor R_term connected between a ground voltage GND source, and either a first input terminal of a data input buffer or a first input terminal of a command/address input buffer. When data or a command/address signal is received via the termination resistor unit of FIG. 7C, a reference voltage for receiving the data or the command/address signal may be lower than in the termination resistor unit of FIG. 7B. For example, when the termination resistor unit of FIG. 7C is used, a corresponding reference voltage may have a level between VDDQ/2 and a ground voltage GND.

Figure 8A:
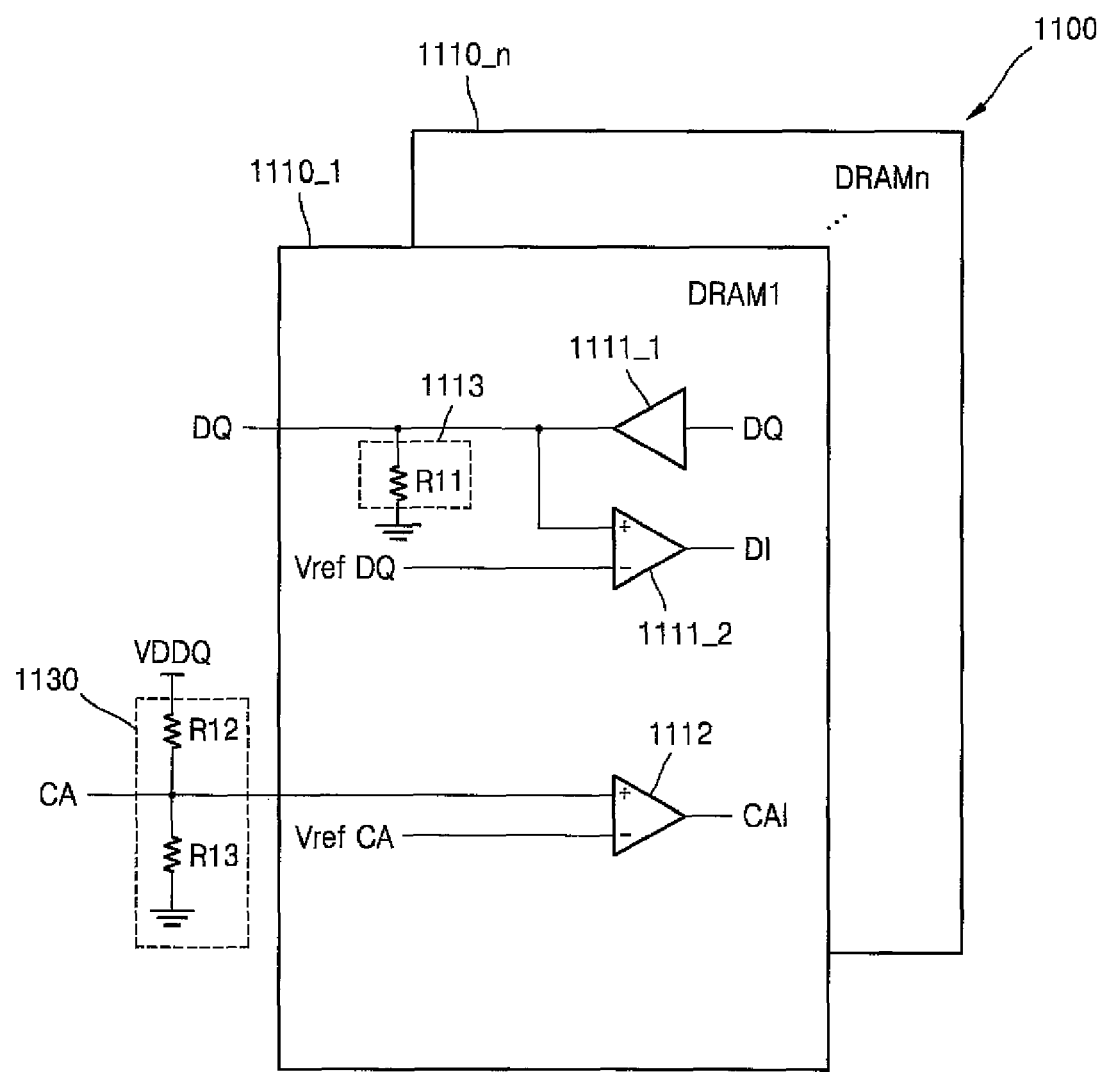
FIGS. 8A to 8C are circuit diagrams of representative memory modules, according to illustrative embodiments.
Figure 8B:
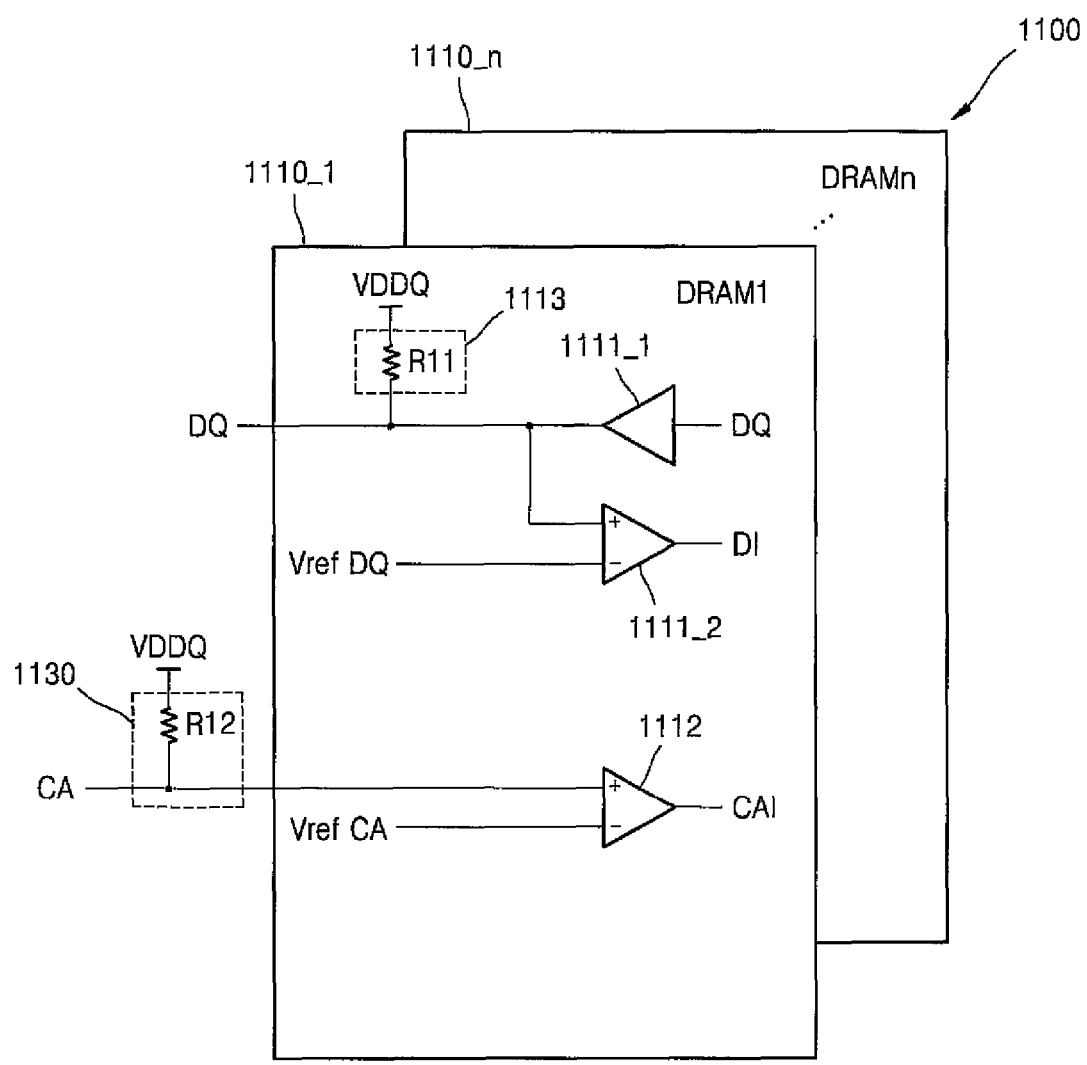
Figure 8C:
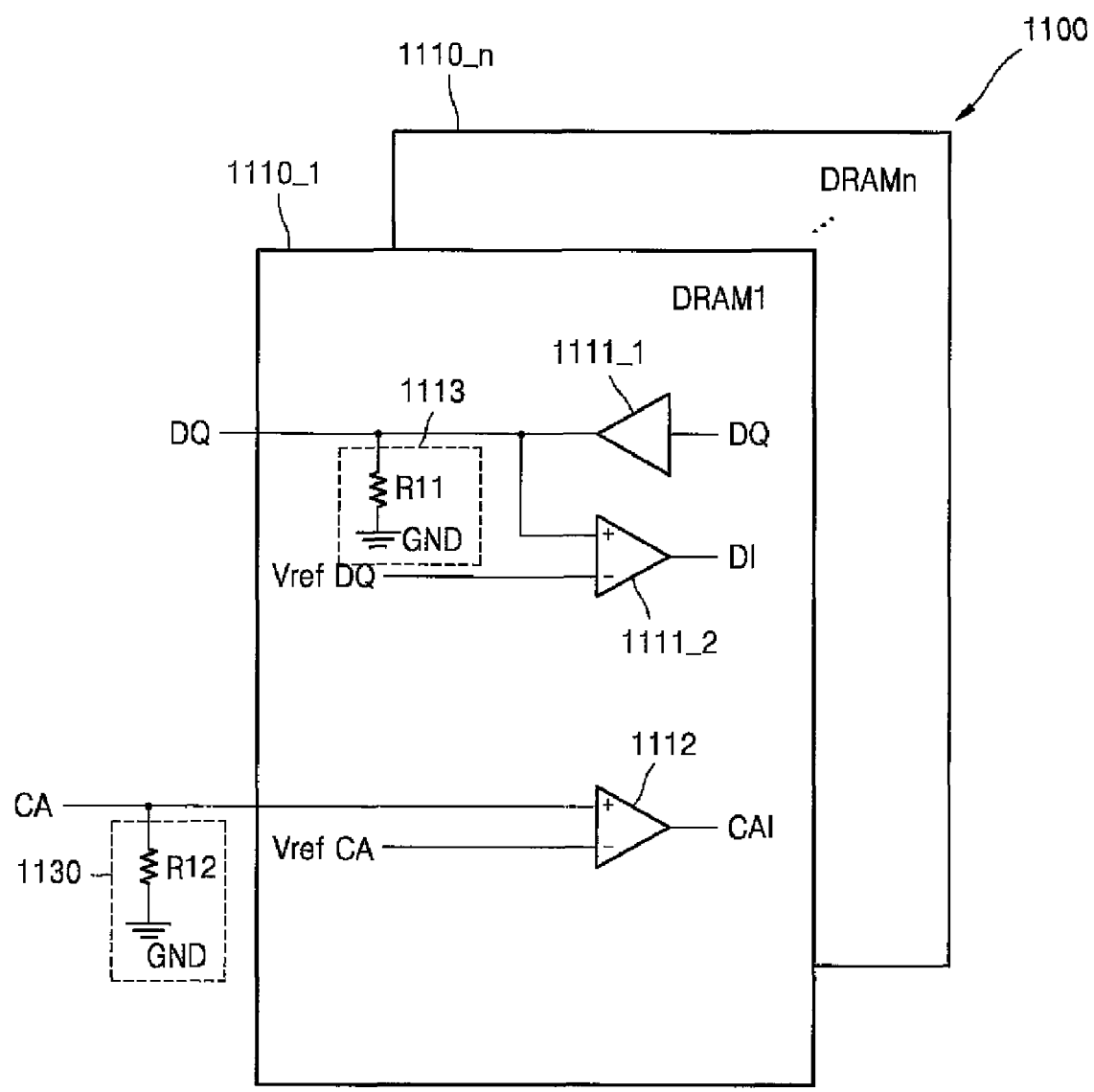

FIGS. 8A to 8C are circuit diagrams showing various configurations of memory module 1100, according to illustrative embodiments. FIG. 8A illustrates a case in which first termination resistor unit 1113 is a parallel termination type resistor and second termination resistor unit 1130 is a CTT type resistor. In particular, the first termination resistor unit 1113 has first resistor R11, an end of which is connected to a first input terminal of a data input buffer 1111_2 and the other end of which is connected to a ground voltage GND source. In this case, a first reference voltage VrefDQ may have a level between the ground voltage GND and a voltage VDDQ/2 that is half a power supply voltage VDDQ.

FIG. 8B illustrates a configuration in which both first termination resistor unit 1113 and second termination resistor unit 1130 are parallel termination type resistors. In particular, the first termination resistor unit 1113 may include first resistor R11, one end of which is connected to a first input terminal of data input buffer 1111_2 and the other end of which is connected to a power supply voltage VDDQ source. The second termination resistor unit 1130 may include second resistor R12, one end of which is connected to a first input terminal of command/address input buffer 1112 and the other end of which is connected to the power supply voltage VDDQ source. In this configuration, both a first reference voltage VrefDQ and a second reference voltage VrefCA may be determined to have values between the power supply voltage VDDQ and a voltage VDDQ/2.

FIG. 8C illustrates another configuration in which both first termination resistor unit 1113 and second termination resistor unit 1130 are parallel termination type resistors. In particular, both the first and second termination resistor units 1113 and 1130 are connected to a ground voltage GND source. In this case, the first termination resistor unit 1113 may include first resistor R11, one end of which is connected to a first input terminal of data input buffer 1111_2 and the other end of which is connected to the ground voltage GND source. The second termination resistor unit 1130 may include second resistor R12, one end of which is connected to a first input terminal of command/address input buffer 1112 and the other end of which is connected to the ground voltage GND source. In this case, both a first reference voltage VrefDQ and a second reference voltage VrefCA may be determined to have a value between the ground voltage GND and a voltage VDDQ/2, which is half of a power supply voltage VDDQ.

Figure 9:
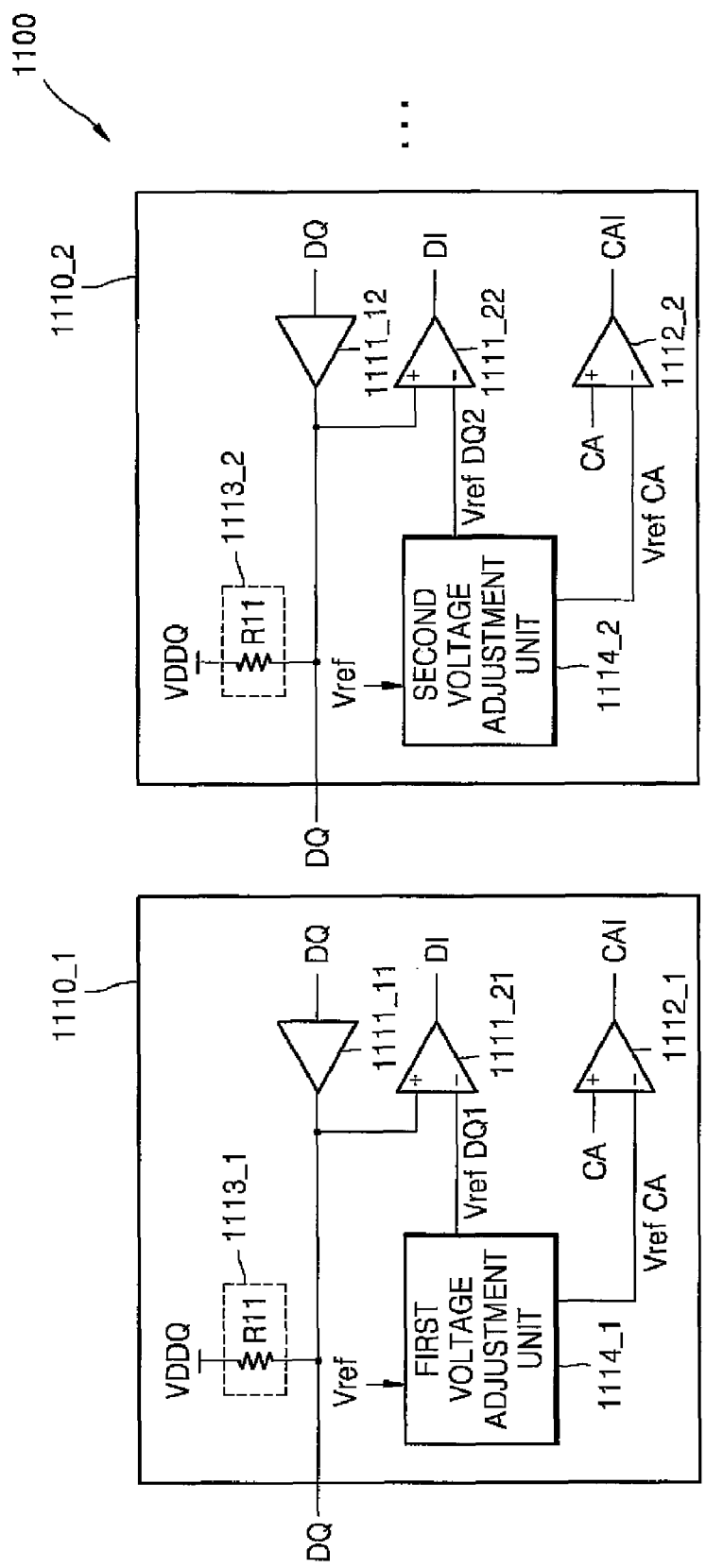
FIG. 9 is a block diagram of a memory module having a voltage adjustment unit, according to an illustrative embodiment.

FIG. 9 is a block diagram of a memory module 1100 having a voltage adjustment unit, according to an illustrative embodiment. The memory module 1100 of FIG. 9 also includes first termination resistor unit 1113 that employs parallel termination and second termination resistor unit 1130 (not shown) that employs CTT, as described above with reference to FIG. 3, for example. Here, first reference voltage VrefDQ for receiving data and second reference voltage VrefCA for receiving a command/address signal may be generated from a predetermined reference voltage Vref by the memory module 1100 (or by at least one semiconductor memory device, e.g., of semiconductor memory devices 1110_1, 1110_2, . . . , included in the memory module 1100.

The semiconductor memory devices 1110_1, 1110_2, . . . are connected in parallel to a system data bus DQBUS for delivering data, via additional buses respectively allocated thereto. Thus, the lengths of data paths of the respective semiconductor memory devices 1110_1, 1110_2, . . . are the same or similar to one another. However, since first input terminals of data input buffers of the respective semiconductor memory devices 1110_1, 1110_2, . . . do not have signal swing characteristics showing a shape symmetric with respect to a predetermined voltage, e.g., a voltage VDDQ/2 that is half a power supply voltage VDDQ, the semiconductor memory devices 1110_1, 1110_2, . . . may have different signal swing characteristics. In this case, the first reference voltage VrefDQ for one semiconductor memory device may be determined to be different from the first reference voltage VrefDQ for another semiconductor memory device.

In order to generate the above reference voltages, each of the semiconductor memory devices 1110_1, 1110_2, . . . included in the memory module 1100 may include a data output buffer 1111_11, 1111_12, a data input buffer 1111_21, 1111_22, and a command/address input buffer 1112_1, 1112_2. In addition, FIG. 9 illustrates a first voltage adjustment unit 1114_1 included in the first semiconductor memory device 1110_1 and second voltage adjustment unit 1114_2 included in the second semiconductor memory device 1110_2.

The first and second voltage adjustment units 1114_1 and 1114_2 respectively generate the first reference voltages VrefDQ1 and VrefDQ2 and/or the second reference voltage VrefCA from predetermined reference voltage Vref. The first reference voltages VrefDQ1 and VrefDQ2 are respectively applied to the corresponding data input buffers. The second reference voltage VrefCA is applied to the command/address input buffers. The first reference voltage VrefDQ1 for the first semiconductor memory device 1110_1 may be determined to be different from the first reference voltage VrefDQ2 for the semiconductor memory device 1110_2. The setting of the first reference voltages VrefDQ1 and VrefDQ2 may be performed by mode register sets (MRS) (not shown) that may be respectively included in the first and second semiconductor memory devices 1110_1 and 1110_2.

For example, when a signal swing level of a first input terminal of the data input buffer 1111_21, 1111_22 is set to be relatively high, the corresponding voltage adjustment unit 1114_1, 1114_2 generates the first reference voltage VrefDQ1, VrefDQ2 to be relatively high. When the signal swing level of the first input terminal of the data input buffer 1111_21, 1111_22 is set to be relatively low, the corresponding voltage adjustment unit 1114_1, 1114_2 generates the first reference voltage VrefDQ1, VrefDQ2 to be relatively low. That is, the voltage adjustment units 1114_1 and 1114_2 respectively adjust the first reference voltages VrefDQ1 and VrefDQ2 to correspond to the signal swing characteristics of data of the first and second semiconductor memory devices 1110_1 and 1110_2. If the signal swing level of the first input terminal of the data input buffer 1111_21 of the first semiconductor memory device 1110_1 is different from the signal swing level of the first input terminal of the data input buffer 1111_22 of the second semiconductor memory device 1110_2, the first reference voltage VrefDQ1 generated by the first voltage adjustment unit 1114_1 may be set to be different from the first reference voltage VrefDQ2 generated by the second voltage adjustment unit 1114_2.

Figure 10:
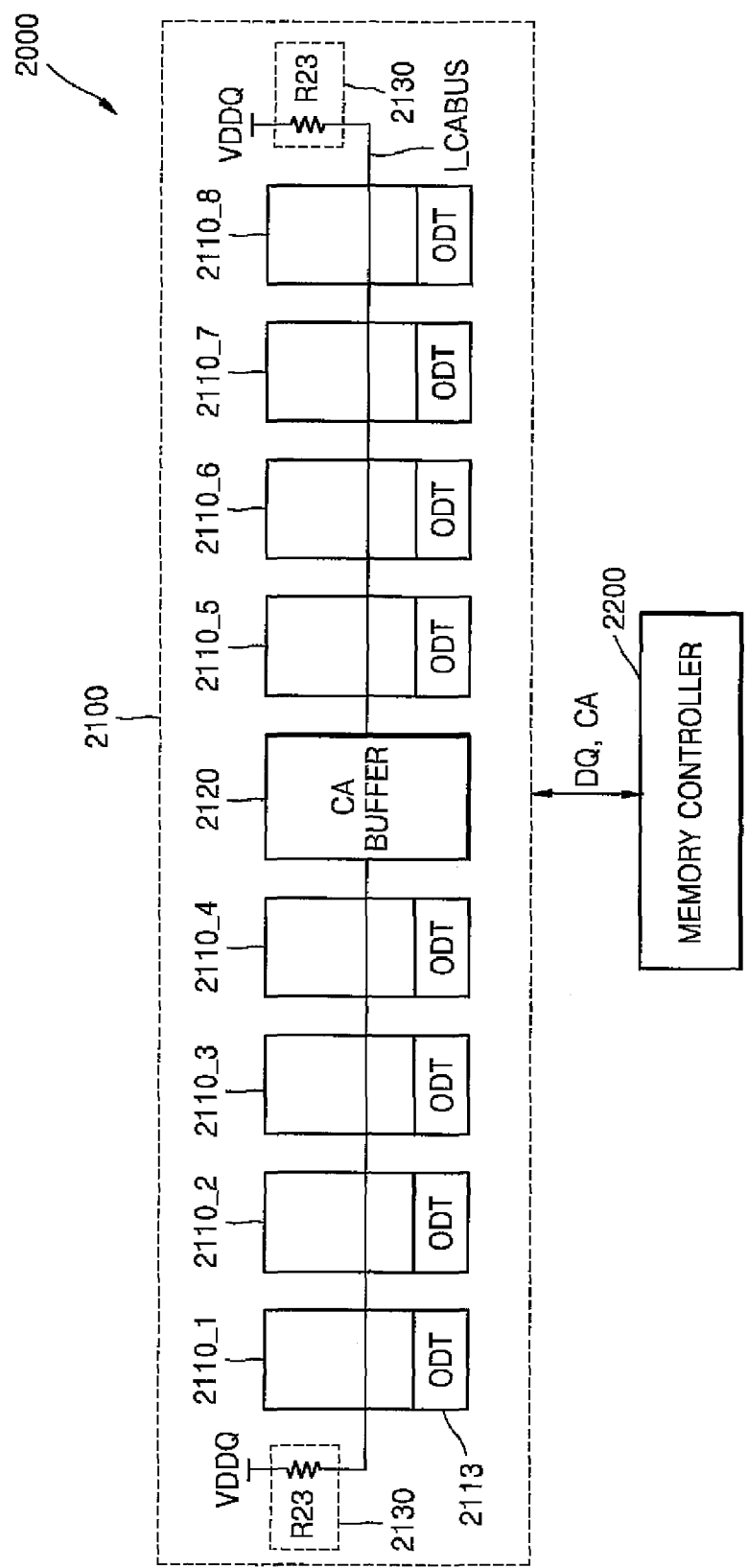
FIG. 10 is a block diagram of a semiconductor memory system, according to another illustrative embodiment.

FIG. 10 is a block diagram of a semiconductor memory system 2000, according to another illustrative embodiment. Referring to FIG. 10, the semiconductor memory system 2000 includes memory module 2100 having at least one semiconductor memory device, e.g., first to eighth semiconductor memory devices 2110_1 to 2110_8, and memory controller 2200 that communicates data and command/address signals with the memory module 2100 via a system bus. The memory module 2100 further includes command/address buffer 2120 that temporarily stores the command/address signal received from the memory controller 2200, and internal command/address bus I_CABUS that delivers the command/address signal to the first to eighth semiconductor memory devices 2110_1 to 2110_8. Also, in the system of FIG. 10, the memory controller 2200 may apply the first reference voltage VrefDQ and the second reference voltage VrefCA to the memory module 2100 via first system bus VrefDQBUS and second system bus VrefCABUS, as illustrated in FIG. 2, for example. However, as described above, the first reference voltage VrefDQ and the second reference voltage VrefCA may be generated from a predetermined power supply voltage in the memory module 2100 (or in the first to eighth semiconductor memory devices 2110_1 to 2110_8).

The construction and operation of the semiconductor memory system 2000 illustrated in FIG. 10 will now be described, although the description of features of the semiconductor memory system 2000 that are substantially the same as those of the semiconductor memory system 1000 of FIG. 2 will not be repeated.

As illustrated in FIG. 10, the semiconductor memory system 2000 includes at least one termination resistor unit. In detail, each of the first to eighth semiconductor memory devices 2110_1 to 2110_8 includes a first termination resistor unit 2113 having an ODT type device in order to receive data DQ. At least one second termination resistor unit 2130 is located outside the first to eighth semiconductor memory devices 2110_1 to 2110_8 on the memory module 2100 in order to receive a command/address signal CA. In particular, according to the current embodiment, each first termination resistor unit 2113 has a CTT structure, and each second termination resistor unit 2130 has a parallel termination structure. As described above with respect to other embodiments, the first reference voltage VrefDQ and the second reference voltage VrefCA may be either applied from the memory controller 2200 to the memory module 2100 via a predetermined system bus (not shown), or may be generated from a predetermined reference voltage in the memory module 2100 (or in the first to eighth semiconductor memory devices 2110_1 to 2110_8).

The semiconductor memory system 2000 will now be described in detail with reference to FIG. 11. For convenience of explanation, the semiconductor memory system 2000 will be described with respect to the construction and operation of the first semiconductor memory device 2110_1.

Figure 11:
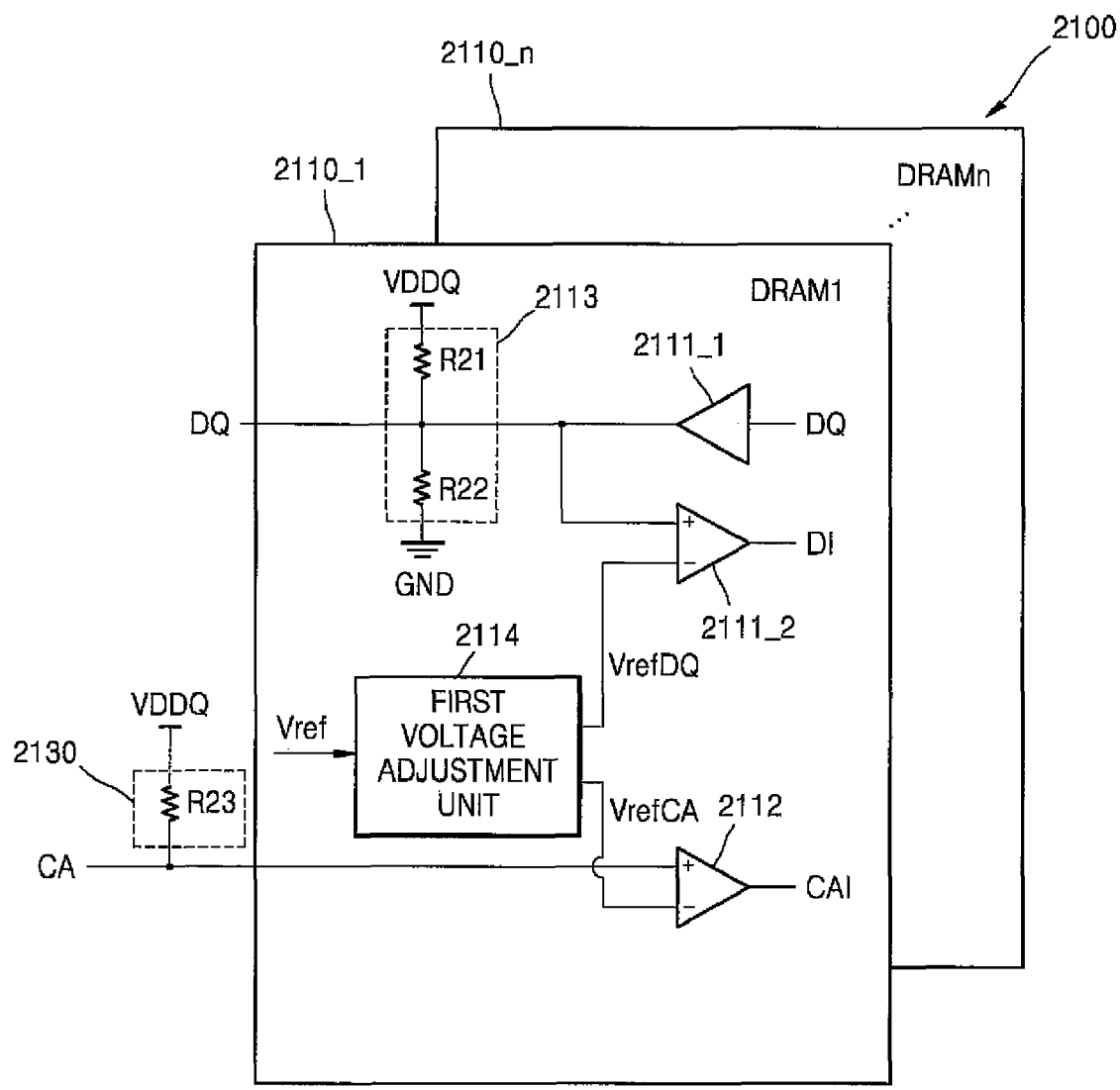
FIG. 11 is a circuit diagram of a memory module having a voltage adjustment unit, according to an illustrative embodiment.

As illustrated in FIG. 11, the first semiconductor memory device 2110_1 includes data output buffer 2111_1, data input buffer 2111_2 and command/address input buffer 2112. The data input buffer 2111_2 receives external data DQ via a first input terminal, receives a first reference voltage VrefDQ via a second input terminal, and generates internal data DI by using differential signaling. The command/address input buffer 2112 receives a command/address signal CA via a first input terminal, receives a second reference voltage VrefCA via a second input terminal, and generates an internal command/address signal CAI by using differential signaling.

In the depicted embodiment, the first termination resistor unit 2113 includes a first resistor R21 connected between a power supply voltage VDDQ source and a first input terminal of the data input buffer 2111_2, and a second resistor R22 connected between the first input terminal of the data input buffer 2111_2 and a ground voltage GND source. The second termination resistor unit 2130 includes a third resistor R23 connected between the power supply voltage VDDQ source and a first input terminal of the command/address input buffer 2112. Although FIG. 11 shows each of the first to third resistors R21 to R23 of the first and second termination resistor units 2113 and 2130 as a single resistor for purposes of illustration, it is understood that each of them may include two or more resistors.

Since the first termination resistor unit 2113 has the CTT structure, the signal swing level of the first input terminal of the data input buffer 2111_2 has a shape symmetric with respect to a predetermined voltage. For example, when the same voltage is applied to the first resistor R21 and the second resistor R22 and the power supply voltage VDDQ source and the ground voltage GND source are connected in series, then the signal swing level of the first input terminal of the data input buffer 2111_2 has a shape symmetric with respect to a voltage VDDQ/2, which is half the power supply voltage VDDQ. Although not shown, a leakage current path is formed in the first termination resistor unit 2113 having the CTT structure, and thus, power consumption in the first termination resistor unit 2113 may occur. However, since the first termination resistor unit 2113 is located in the first semiconductor memory device 2110_1, an additional switch (not shown) may also be located in the first termination resistor unit 2113, thereby reducing power consumption therein. For example, it is possible to reduce power consumption in the first semiconductor memory device 2100_1 in a standby state by disposing a switch between the power supply voltage VDDQ source and the first resistor R21 and a switch between the ground voltage GND source and the second resistor R22.

Since the second termination resistor unit 2130 has the parallel termination structure, the signal swing level of the first input terminal of the command/address input buffer 2112 that receives the command/address signal CA is different from that of the first input terminal of the data input buffer 2111_2. For example, when the third resistor R23 is connected between the power supply voltage VDDQ source and the first input terminal of the command/address input buffer 2112, a voltage corresponding to the signal swing level of the first input terminal of the command/address input buffer 2112 is higher than a voltage corresponding to the signal swing level of the first input terminal of the data input buffer 2111_2. In this case, the second reference voltage VrefCA for generating the internal command/address signal CAI is determined to be higher than the first reference voltage VrefDQ. The second reference voltage VrefCA may be determined to be a level between the power supply voltage VDDQ and the first reference voltage VrefDQ.

When the third resistor R23 is connected between the ground voltage GND source and the first input terminal of the command/address input buffer 2112, the signal swing level of the first input terminal of the command/address input buffer 2112 is lower than that of the first input terminal of the data input buffer 2111_2. In this case, the second reference voltage VrefCA may be determined to be a level between the ground voltage GND and the first reference voltage VrefDQ.

That is, when the type of the first termination resistor unit 2113 is different from that of the second termination resistor unit 2130, the first reference voltage VrefDQ and the second reference voltage VrefCA are determined to be different from each other. When the first reference voltage VrefDQ and the second reference voltage VrefCA are applied from the memory controller 2200, the memory controller 2200 generates the first reference voltage VrefDQ and the second reference voltage VrefCA to be different from each other, and applies them to the memory module 2100. Alternatively, when the first reference voltage VrefDQ and the second reference voltage VrefCA are generated by the voltage adjustment unit 2114 included in the semiconductor memory device 2110_1, the voltage adjustment unit 2114 generates the first reference voltage VrefDQ and the second reference voltage VrefCA from the reference voltage Vref to be different from each other.

In a standby state, the first input terminal of the command/address input buffer 2112 of each of the semiconductor memory devices 2110_1 to 2110_8 is precharged to the power supply voltage VDDQ corresponding to a high level of the corresponding signal swing amplitude. The length of a path in which the command/address signal CA is received from the command/address buffer 2120 is not the same in the first to eighth semiconductor memory devices 2110_1 to 2110_8. Thus, loads on the first input terminals of the command/address input buffers 2112 of the respective first to eighth semiconductor memory devices 2110_1 to 2110_8 are not the same, and the signal swing characteristics of the first input terminals of the command/address input buffers 2112 of the respective first to eighth semiconductor memory devices 2110_1 to 2110_8 are not the same. Accordingly, the second reference voltages VrefCA that are respectively applied to the first to eighth semiconductor memory devices 2110_1 to 2110_8 may be adjusted to be different from one another.

To this end, the voltage adjustment units 2114 of the respective semiconductor memory devices 2110_1 to 2110_8 may respectively generate the second reference voltages VrefCA to be different from one another. When the distance between the first semiconductor memory device 2110_1 and the command/address buffer 2120 is relatively small, the voltage adjustment unit 2114 in the first semiconductor memory device 2110_1 reduces the amount of the adjustment for the second reference voltage VrefCA. Also, when the distance between the $n^{th}$ semiconductor memory device 2110_n and the command/address buffer 2120 is relatively large, a voltage adjustment unit (not shown) in the $n^{th}$ semiconductor memory device 2110_n increases the amount of the adjustment for the second reference voltage VrefCA.

Figure 12A:
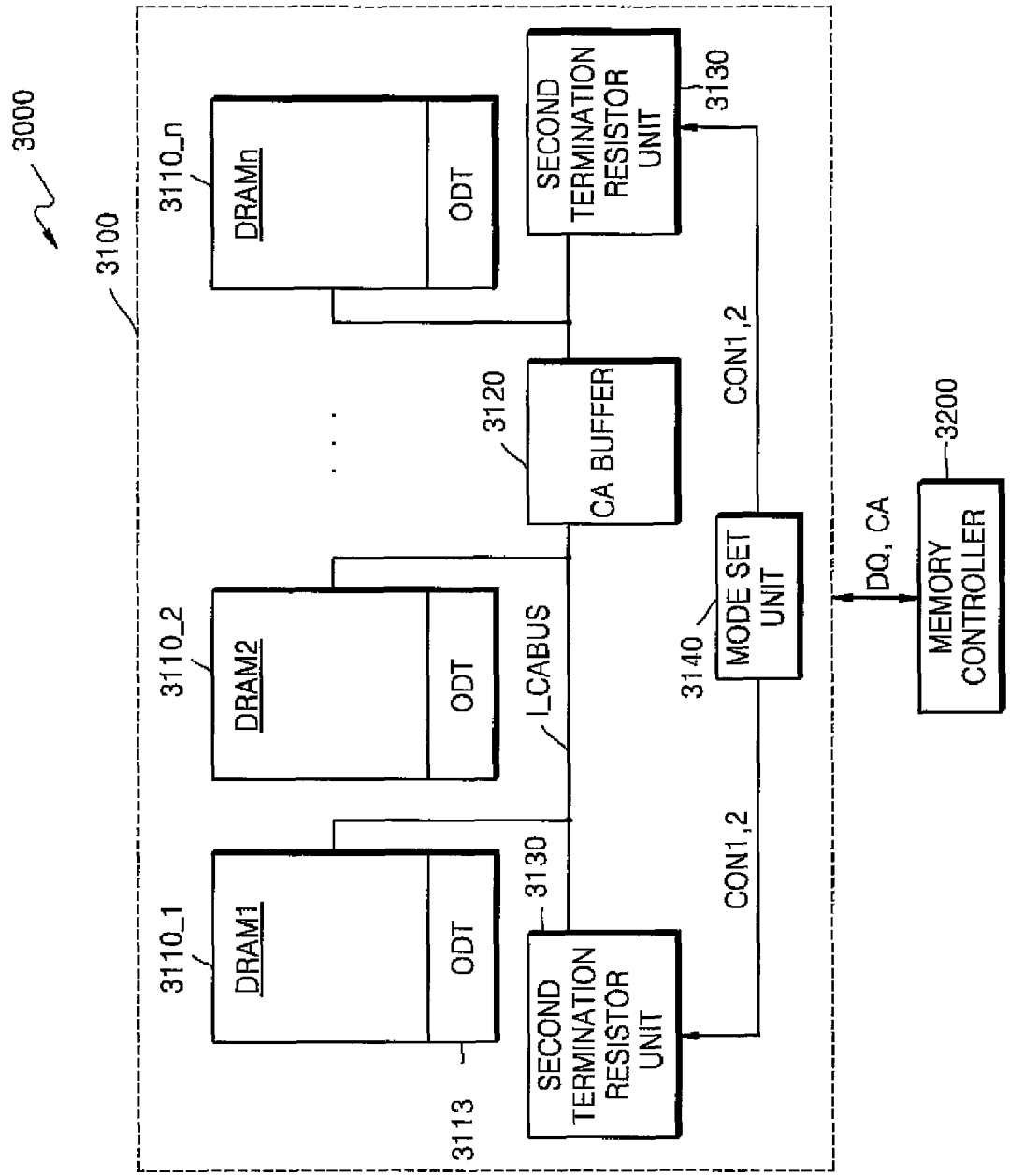
FIGS. 12A and 12B are respectively block and circuit diagrams of a semiconductor memory system, according to another embodiment of the inventive concept.
Figure 12B:
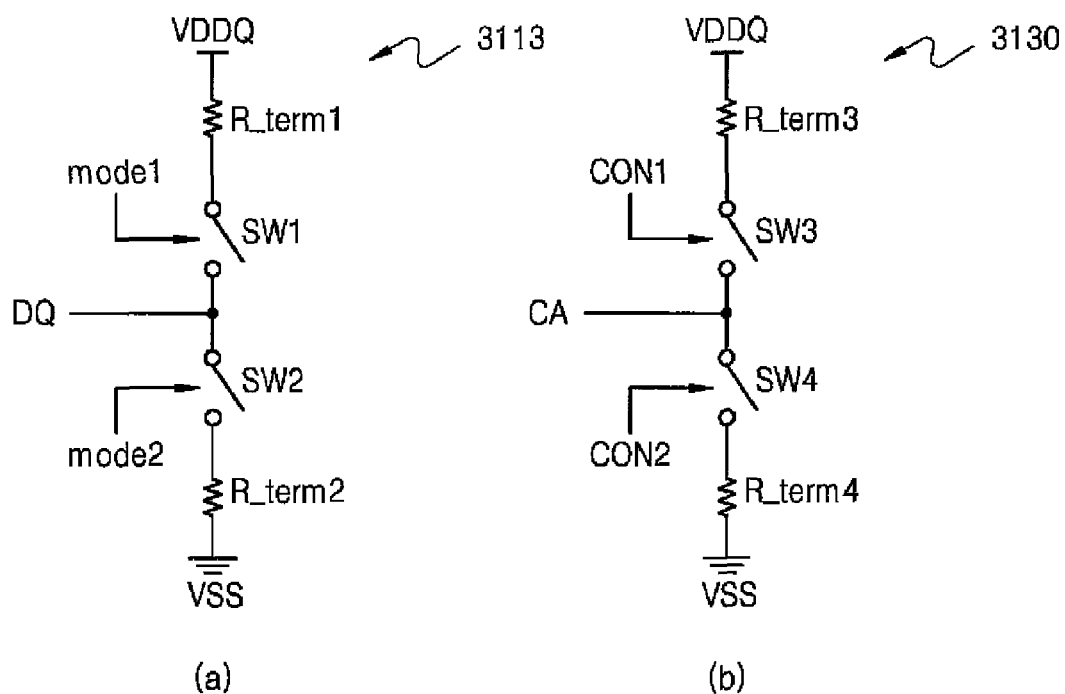

FIGS. 12A and 12B respectively are block and circuit diagrams of a semiconductor memory system 3000, according to another embodiment of the inventive concept. That is, FIG. 12A is a block diagram of the semiconductor memory system 3000 and FIG. 12B includes circuit diagrams (a) and (b) of first and second termination resistor units 3113 and 3130 included in the semiconductor memory system 3000, according to another illustrative embodiment.

As illustrated in FIG. 12A, the semiconductor memory system 3000 includes memory module 3100 having at least one semiconductor memory device, e.g., semiconductor memory devices 3110_1 to 3110_n, and memory controller 3200 that communicates data DQ and command/address signal CA with the memory module 3100. Each of the semiconductor memory devices 3110_1 to 3110_n includes first termination resistor unit 3113 having an ODT type device that is connected to a data input/output buffer (not shown). The memory module 3100 further includes command/address buffer 3120 that temporarily stores the command/address signal CA received from the memory controller 3200, at least one second termination resistor unit 3130 connected to at least one node of an internal command/address bus I_CA-BUS, and mode set unit 3140 that provides at least one control signal to the second termination resistor unit 3130.

As described above with respect to other embodiments, a data input buffer (not shown) included in each of the semiconductor memory devices 3110_1 to 3110_n has a first input terminal through which the data DQ is received and that is connected to the first termination resistor unit 3113, and a second input terminal through which a first reference voltage VrefDQ is received. The first reference voltage VrefDQ corresponds to the signal swing characteristics of the first input terminal of the data input buffer. Similarly, a command/address input buffer (not shown) included in each of the semiconductor memory devices 3110_1 to 3110_n has a first input terminal through which the command/address signal CA is received and that is connected to the second termination resistor unit 3130, and a second input terminal through which a second reference voltage VrefCA is received. The second reference voltage VrefCA corresponds to the signal swing characteristics of the first input terminal of the command/address input buffer.

In the depicted embodiment, the type of the first termination resistor unit 3113 and the type of the second termination resistor unit 3130 may be changed based on a switching operation. For example, the types of the first termination resistor unit 3113 and the second termination resistor unit 3130 may be different from each other. To this end, the first termination resistor unit 3113 may be switched to a CTT type resistor and the second termination resistor unit 3130 may be switched to a parallel termination type resistor and vice versa.

FIG. 12B(a) is a circuit diagram of the first termination resistor unit 3113 according to an illustrative embodiment. FIG. 12B(b) is a circuit diagram of the second termination resistor unit 3130 according to an illustrative embodiment. Referring to FIG. 12B(a), the first termination resistor unit 3113 may include a first resistor R_term1 and a first switch SW1 that are connected in series between a power supply voltage VDDQ source and the first input terminal of the data input buffer. The first termination resistor unit 3113 may also include a second resistor R_term2 and a second switch SW2 that are connected in series between a ground voltage VSS source and the first input terminal of the data input buffer. The first termination resistor unit 3113 is disposed in the form of an ODT device in each of the semiconductor memory devices 3110_1 to 3110_n. The first and second switches SW1 and SW2 may be controlled in response to control signals mode1 and mode2 generated in each of the semiconductor memory devices 3110_1 to 3110_n. The levels of the control signals mode1 and mode2 may be predetermined, and they may be provided by a mode register set (not shown).

As illustrated in FIG. 12B(b), the second termination resistor unit 3130 is positioned on the memory module 3100 and outside each of the semiconductor memory devices 3110_1 to 3110_n. The second termination resistor unit 3130 may include a third resistor R_term3 and a third switch SW3 that are connected in series between a power supply voltage VDDQ source and the first input terminal of the command/address input buffer. The second termination resistor unit 3130 may also include a fourth resistor R_term4 and a fourth switch SW4 that are connected in series between a ground voltage VSS source and the first input terminal of the command/address input buffer. The third and fourth switches SW1 and SW2 may be controlled in response to control signals CON1 and CON2 generated by the mode set unit 3140. The levels of the control signals CON1 and CON2 may also be predetermined, and the mode set unit 3140 may be set in association with a mode register set that controls the type of the first termination resistor unit 3113.

For example, when the first termination resistor unit 3113 is a CTT type resistor and the second termination resistor unit 3130 is a parallel termination type resistor, the first and second switches SW1 and SW2 are turned on in response to the control signals mode1 and mode2, the third switch SW3 is turned on in response to the control signal CON1, and the fourth switch SW4 is turned off in response to the control signal CON2. When the first termination resistor unit 3113 is a parallel termination type resistor and the second termination resistor unit 3130 is a CTT type resistor, the first switch SW1 is turned on in response to the control signal mode1 and the second switch SW2 is turned off in response to the control signal mode2. The third and fourth switches SW3 and SW4 are turned on in response to the control signals CON1 and CON2. As described above, it is possible to optimally embody termination devices in a semiconductor memory system by using termination resistor units, the types of which can be switched around according to the signal delivery characteristics of the semiconductor memory system.

Termination devices and a reference voltage according to an embodiment of the inventive concept may be applied to various types of semiconductor memory modules and various types of semiconductor memory systems. In the above embodiments, termination devices and a reference voltage are applied to a Registered Dual In-line Memory Module (RDIMM), but may also be applied to various other types of semiconductor memory modules, such as a Single In-Line Memory Module (SIMM), a Dual In-line Memory Module (DIMM), a Small-Outline DIMM (SO-DIMM), an Unbuffered DIMM (UDIMM), a Fully-Buffered DIMM (FB-DIMM), a Rank-Buffered DIMM (RBDIMM), a Load-Reduced DIMM (LRDIMM), a mini-DIMM, and a micro-DIMM, without departing from the scope of the present teachings. Embodiments in which termination devices and a reference voltage are applied to one of these various other types of semiconductor memory modules are described below. However, the inventive concept is not limited to the above semiconductor memory modules, and may also be applied to other types of semiconductor memory modules in substantially the same or similar manner, as would be apparent to one of ordinary skill in the art.

Figure 13A:
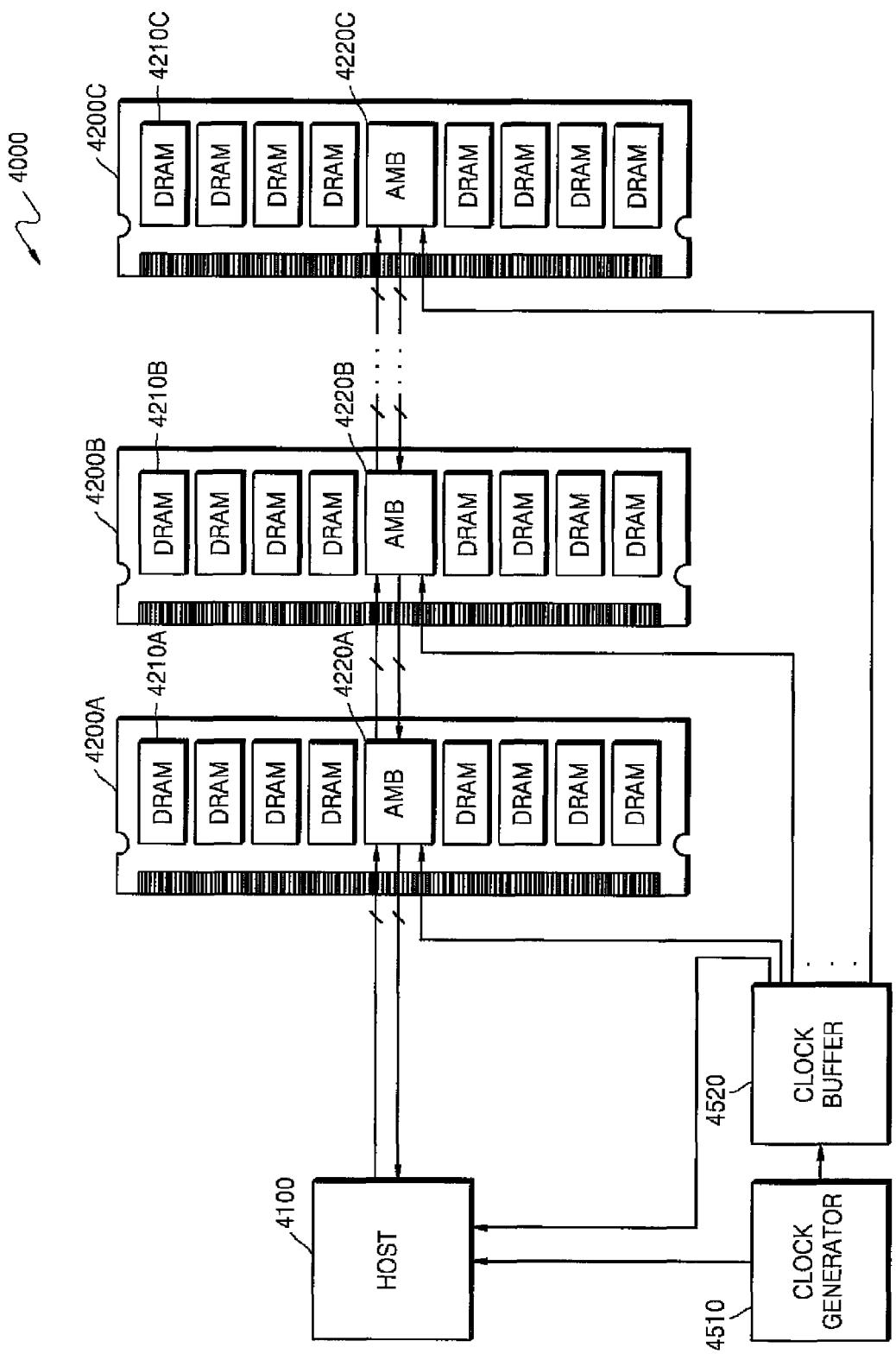
FIG. 13A is a block diagram of a semiconductor memory system, according to an illustrative embodiment.

FIG. 13A is a block diagram illustrating a semiconductor memory system 4000 according to an embodiment of the inventive concept. Referring to FIG. 13A, the semiconductor memory system 4000 includes a host 4100 and one or more memory modules 4200A, 4200B, . . . 4200C. The representative memory modules 4200A, 4200B, . . . 4200C may be FBDIMMs, for example. In this case, each of the memory modules 4200A, 4200B, . . . 4200C may include at least one memory device and an Advanced Memory Buffer (AMB). For example, the first memory module 4200A may include an AMB 4220A and multiple memory devices 4210A.

Each of the memory modules 4200A, 4200B, . . . 4200C communicates with an external host 4100. For example, the external host 4100 and the AMBs 4220A, 4220B, . . . 4220C may be connected to each other according to a point-to-point manner. One of the AMBs 4220A, 4220B, . . . 4220C included in the memory modules 4200A, 4200B, . . . 4200C, respectively, may exchange a packet with another one of the AMBs 4220A, 4220B, . . . 4220C. Thus, the total number of modules connected to the semiconductor memory system 4000 may be increased, thereby increasing the memory capacity of the semiconductor memory system 4000. Also, since the semiconductor memory system 4000 includes FBDIMMs using a packet protocol, for example, the semiconductor memory system 4000 may operate at high speeds. The semiconductor memory system 4000 including the FBDIMMs may further include a clock generation unit 4510 and a clock buffer 4520. A clock signal generated by the clock generation unit 4510 or the clock buffer 4520 may be supplied to the host 4100 and/or the memory modules 4200A, 4200B, . . . 4200C.

Figure 13B:
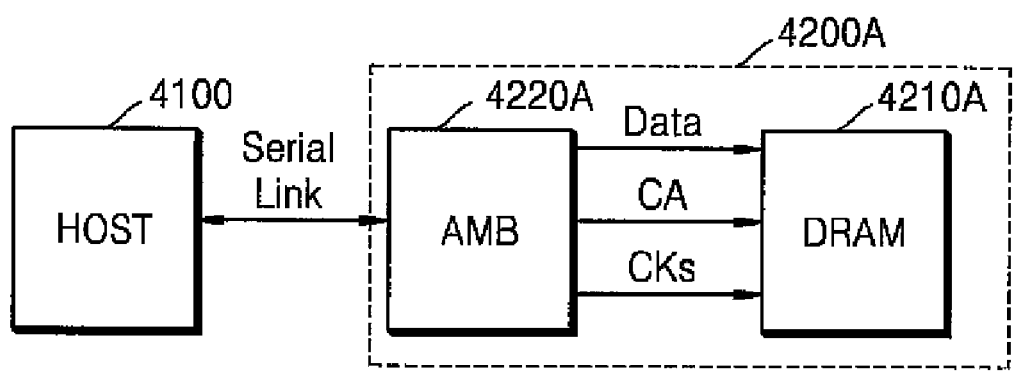
FIG. 13B is a block diagram illustrating a communication method employed by the semiconductor memory system of FIG. 13A, according to an illustrative embodiment.

FIG. 13B is a block diagram illustrating a communication method employed by the semiconductor memory system of FIG. 13A, according to an embodiment of the inventive concept. In FIG. 13B, only the host 4100 and one representative memory module, first memory module 4200A, are illustrated for convenience of explanation. Referring to FIG. 13B, the host 4100 and an AMB 4220A of the first memory module 4200A exchange a packet with each other according to a serial communication method. The AMB 4220A of the first memory module 4200A exchanges a packet with an AMB of an adjacent memory module (not shown in FIG. 13B), such as the AMB 4220B of the second memory module 4200B. The packet may include a command/address CA, a clock signal CKs, and data Data. Although not shown, a reference voltage for the data DATA and a reference voltage for the command/address CA are applied to the memory device 4210A. The reference voltage for the data DATA and the reference voltage for the command/address CA may be applied from the host 4100 to the AMB 4220A and finally to the memory device 4210A, or may be generated from a predetermined voltage in the memory device 4210A.

Figure 14A:
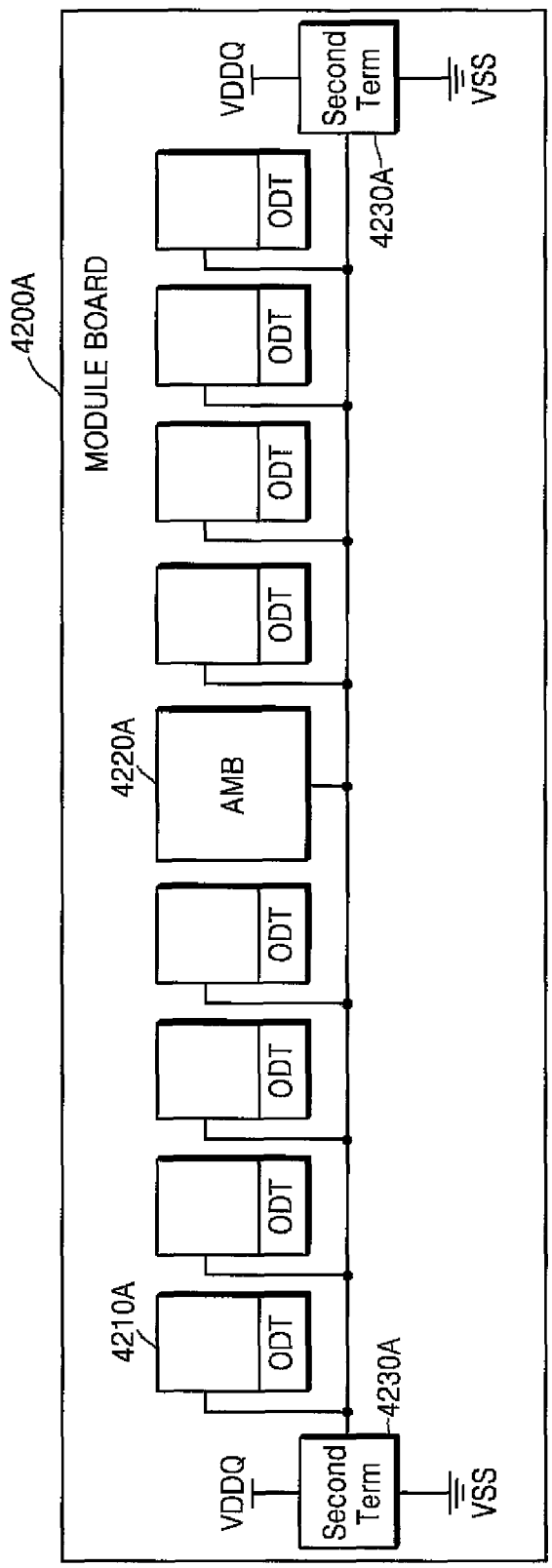
FIG. 14A is a block diagram of a memory module illustrated in FIG. 13A or 13B, having first and second termination resistors, according to an illustrative embodiment.

FIG. 14A is a block diagram of memory module 4200A illustrated in FIG. 13A or 13B, having first and second termination resistors, according to an embodiment of the inventive concept. Referring to FIG. 14A, the first memory module 4200A may include AMB 4220A and multiple memory devices 4210A. The AMB 4220A of the first memory module 4200A exchanges a packet with the host 4100, shown in FIG. 13A or 13B, or an AMB of another memory module. For example, the packet may include a command/address and data, and the command/address and data included in the packet may be buffered.

The AMB 4220A provides the command/address and data to at least one memory device 4210A. Although FIG. 14A illustrates a path along which the command/address is delivered as a signal transmission path, the first memory module 4200A further includes at least one path for delivering data to at least one memory device 4210A, respectively. Also, referring to FIG. 14A, each of the memory devices 4210A includes a first termination resistor unit which is an ODT device for receiving data. Multiple second termination resistor units 4230A are disposed on a bus of a module board to deliver the command/address. The second termination resistor units 4230A may be connected to both ends of the bus, respectively, and each of the second termination resistor units 4230A includes at least one resistor. For example, the second termination resistor unit 4230A may include center tap terminal (CTT) or parallel termination.

Figure 14B:
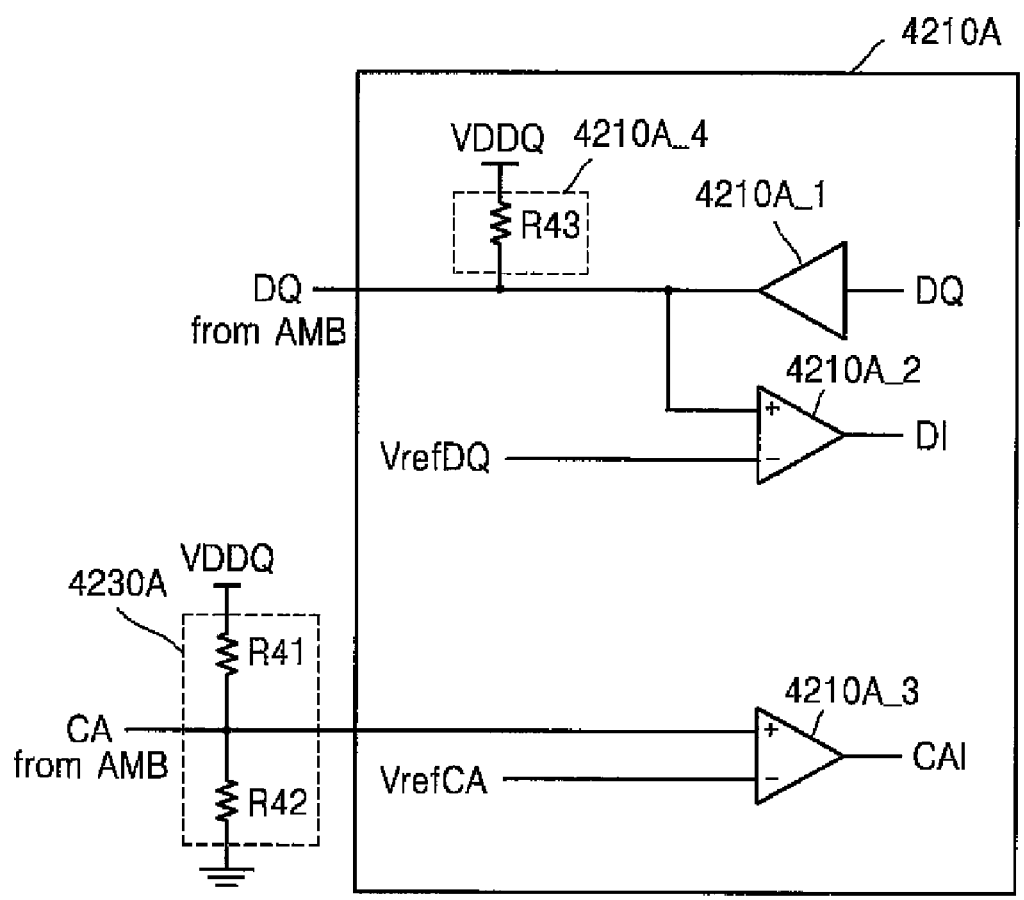
FIGS. 14B to 14D are circuit diagrams of representative memory devices illustrated in FIG. 14A, according to illustrative embodiments.
Figure 14C:
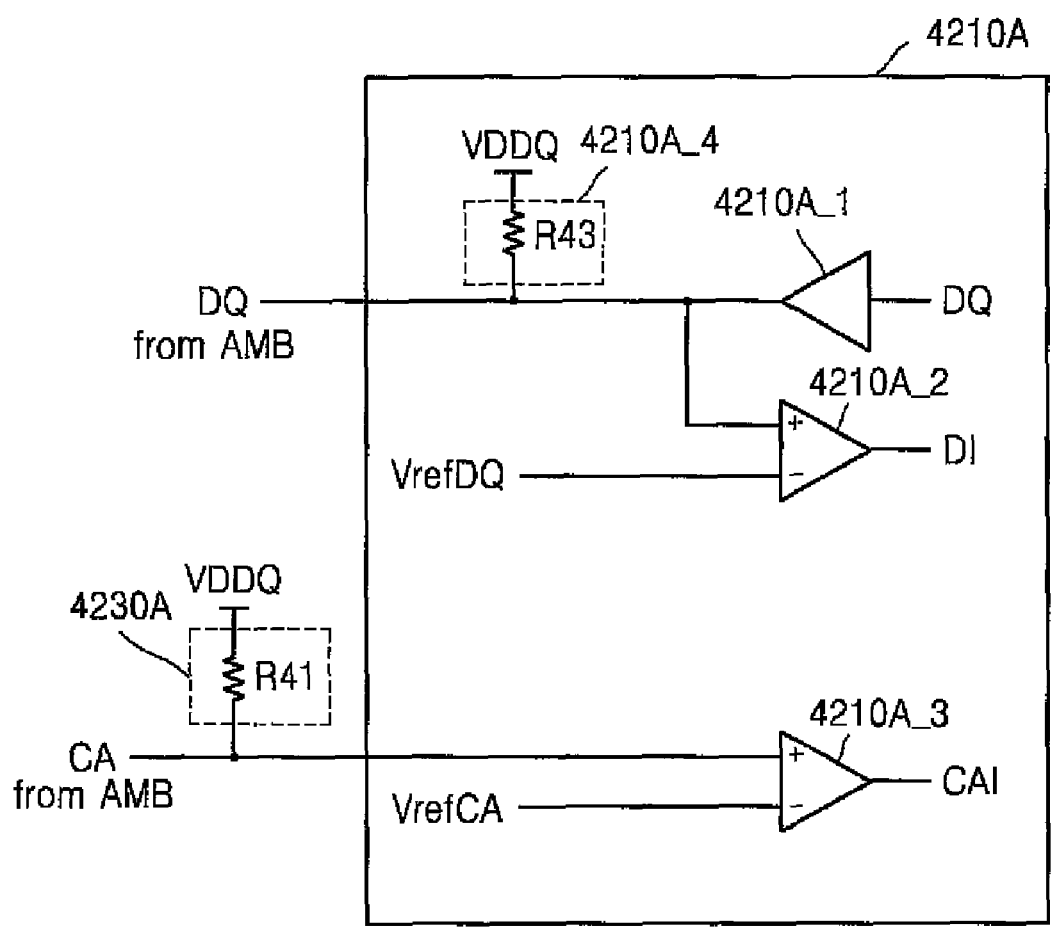
Figure 14D:
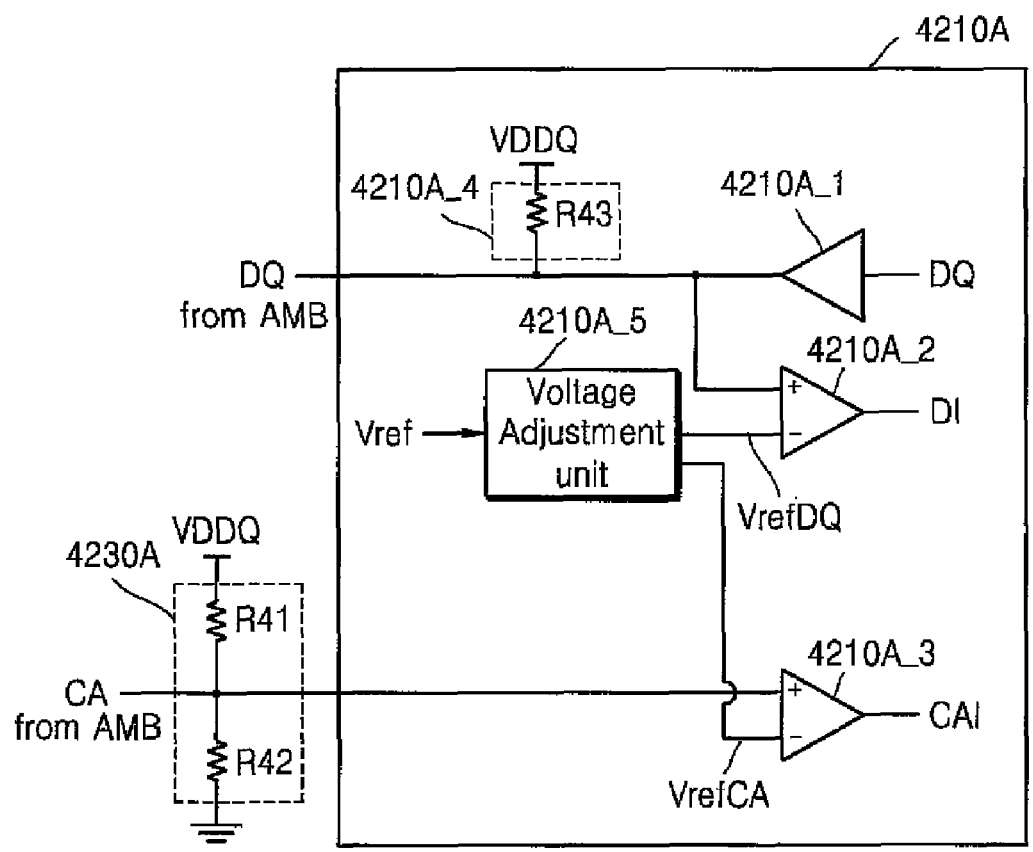

FIGS. 14B to 14D are circuit diagrams illustrating configurations of the memory device 4210A illustrated in FIG. 14A, according to embodiments of the inventive concept. Referring to FIG. 14B, the memory device 4210A may include a data output buffer 4210A_1, a data input buffer 4210A_2, a command/address input buffer 4210A_3, and a first termination resistor unit 4210A_4. FIG. 14B illustrates a configuration in which the first termination resistor unit 4210A_4, which is an ODT device disposed on the memory device 4210A, and the second termination resistor unit 4230A disposed on a module board are different termination types, according to an embodiment of the inventive concept. For example, the first termination resistor unit 4210A_4 employs parallel termination and includes at least one resistor R43 connected between a power supply voltage VDDQ source and an input terminal, e.g., a (+) input terminal, of the data input buffer 4210A_2. The second termination resistor unit 4230A employs center tap termination, and includes at least one resistor R41 connected between the power supply voltage VDDQ source and an input terminal, e.g., a (+) input terminal, of the command/address input buffer 4210A_3 and at least one resistor R42 connected between a ground voltage VSS source and the input terminal, e.g., the (+) input terminal, of the command/address input buffer 4210A_3.

The data input buffer 4210A_2 receives data DQ via an input terminal, e.g., the (+) input terminal. The data DQ may be received via the AMB 4220A included in the first memory module 4200A as shown in FIG. 14A. Also, the data input buffer 4210A_2 receives a reference voltage for data VrefDQ via another input terminal, e.g., the (−) input terminal. The reference voltage for data VrefDQ may be generated in the memory device 4210A or may be applied from an external host (not shown), for example. The command/address input buffer 4210A_3 receives a command/address CA via an input terminal, e.g., the (+) input terminal. The command/address CA may be received via the AMB 4220A. The command/address input buffer 4210A_3 may receive a reference voltage for command/address VrefCA via another input terminal, e.g., the (−) input terminal. The reference voltage for command/address VrefCA may be generated in the memory device 4210A or may be applied from an external host (not shown), for example.

Referring to FIG. 14B, since the types of the first and second termination resistor units 4210A_4 and 4230A are different from each other, the signal swing characteristics of an input terminal, e.g., the (+) input terminal, of the data input buffer 4210A_2 is different from that of an input terminal, e.g., the (+) input terminal, of the command/address input buffer 4210A_3. Thus, the reference voltage for data VrefDQ is determined to be different from the reference voltage for command/address VrefCA. For example, because the signal swing level of an input terminal, e.g., the (+) input terminal, of the data input buffer 4210A_2 is greater than that of an input terminal, e.g., the (+) input terminal, of the command/address input buffer 4210A_3, then the reference voltage for data VrefDQ is determined to be greater than the reference voltage for command/address VrefCA. For example, the reference voltage for data VrefDQ may range between the power supply voltage VDDQ to the reference voltage for command/address VrefCA. Although not shown in FIG. 14B, the first termination resistor unit 4210A_4 may be connected to a ground voltage VSS source rather than the power supply voltage VDDQ source, in which case the signal swing level of an input terminal, e.g., the (+) input terminal, of the data input buffer 4210A_2 is less than that of an input terminal, e.g., the (+) input terminal, of the command/address input buffer 4210A_3. In this case, the reference voltage for data VrefDQ may range between the ground voltage VSS and the reference voltage for command/address VrefCA, for example.

FIG. 14C illustrates a configuration in which both a first termination resistor unit 4210A_4 and a second termination resistor unit 4230A of the memory module 4200A of FIG. 14A are parallel termination type resistor units, according to an embodiment of the inventive concept. For example, the first termination resistor unit 4210A_4 includes a resistor R43 connected to a power supply voltage VDDQ source, and the second termination resistor unit 4230A includes a resistor R41 connected to the power supply voltage VDDQ source. In this case, the reference voltage for data VrefDQ may correspond to the signal swing level of an input terminal, e.g., the (+) input terminal, of the data input buffer 4210A_2, and the reference voltage for command/address VrefCA may correspond to the signal swing level of an input terminal, e.g., the (+) input terminal, of the command/address input buffer 4210A_3. Therefore, the reference voltage for data VrefDQ and the reference voltage for command/address VrefCA may be greater than a voltage VDDQ/2, which is half the power supply voltage VDDQ. Although not shown, the first termination resistor unit 4210A_4 and the second termination resistor unit 4230A may be connected to the ground voltage VSS source, in which case, the reference voltage for data VrefDQ and the reference voltage for command/address VrefCA may be less than the voltage VDDQ/2.

FIG. 14D illustrates a configuration in which the memory module 4200A of FIG. 14A includes a voltage adjustment unit 4210A_5, according to an embodiment of the inventive concept. As described above, a reference voltage for data VrefDQ and a reference voltage for command/address VrefCA may be generated from a predetermined reference voltage Vref in the first memory module 4200A (or the memory device 4210A) of FIG. 14A.

Referring to FIG. 14D, if the first termination resistor unit 4210A_4 has a parallel termination type connected to a power supply voltage VDDQ source, then an intermediate value of a signal swing level of an input terminal, e.g., the (+) input terminal, of the data input buffer 4210A_2 is greater than a voltage VDDQ/2, which is half the power supply voltage VDDQ. The signal swing levels of input terminals, e.g., (+) input terminals, of the respective data input buffers 4210A_2 of the multiple memory devices 4210A of the first memory module 4200A of FIG. 14A may be different from one another, due to physical causes. In this case, the reference voltage for data VrefDQ may be controlled to be different among the memory devices 4200A, respectively.

To this end, as illustrated in FIG. 14D, each of the memory devices 4210A may include the voltage adjustment unit 4210A_5. The voltage adjustment unit 4210A_5 generates the reference voltage for data VrefDQ and the reference voltage for command/address VrefCA from the predetermined reference voltage Vref. The reference voltage for data VrefDQ and the reference voltage for command/address VrefCA generated by the voltage adjustment unit 4210A_5 included in each of the memory devices 4210A may be different from those generated by the voltage adjustment unit 4210A_5 included in the other memory devices 4210A.

Figure 15A:
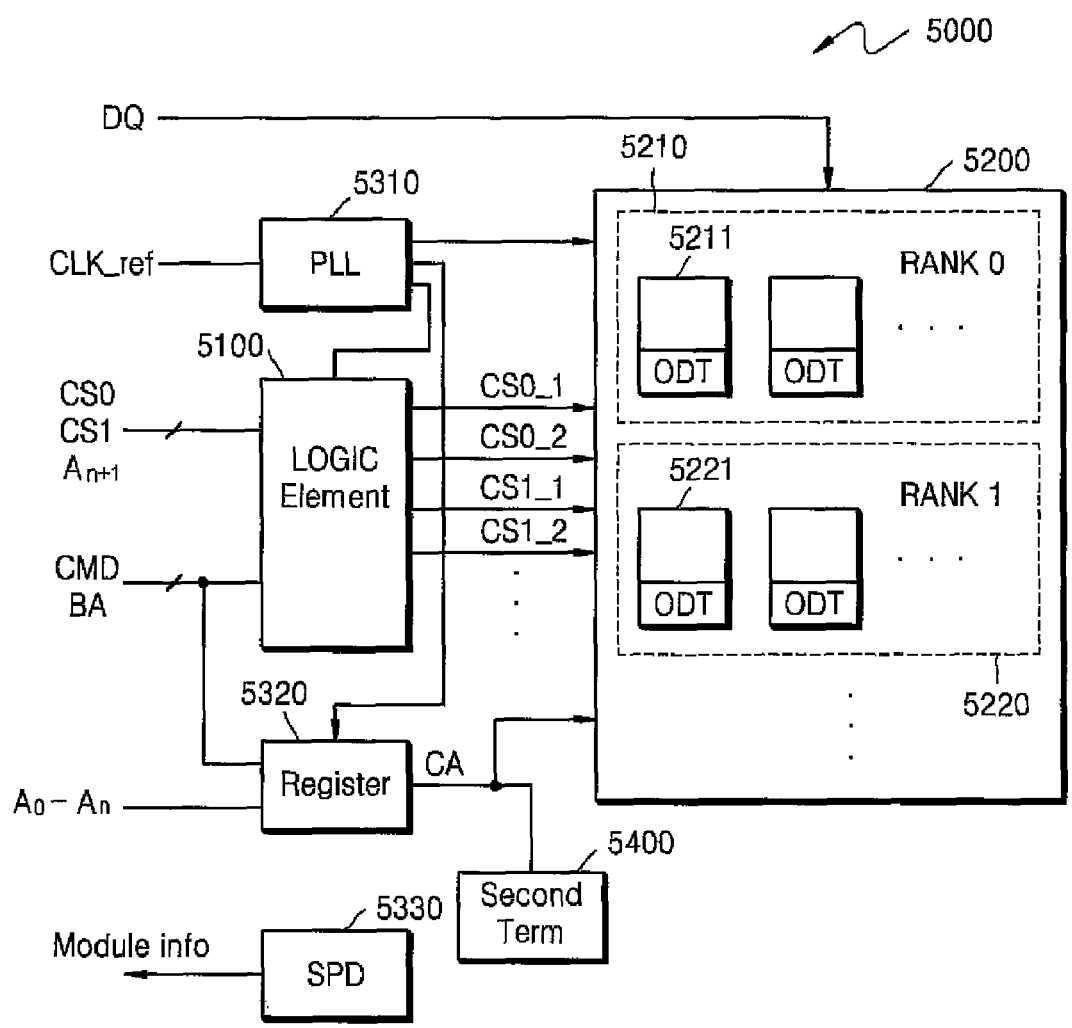
FIGS. 15A and 15B are block diagrams of semiconductor memory modules, according to illustrative embodiments.
Figure 15B:
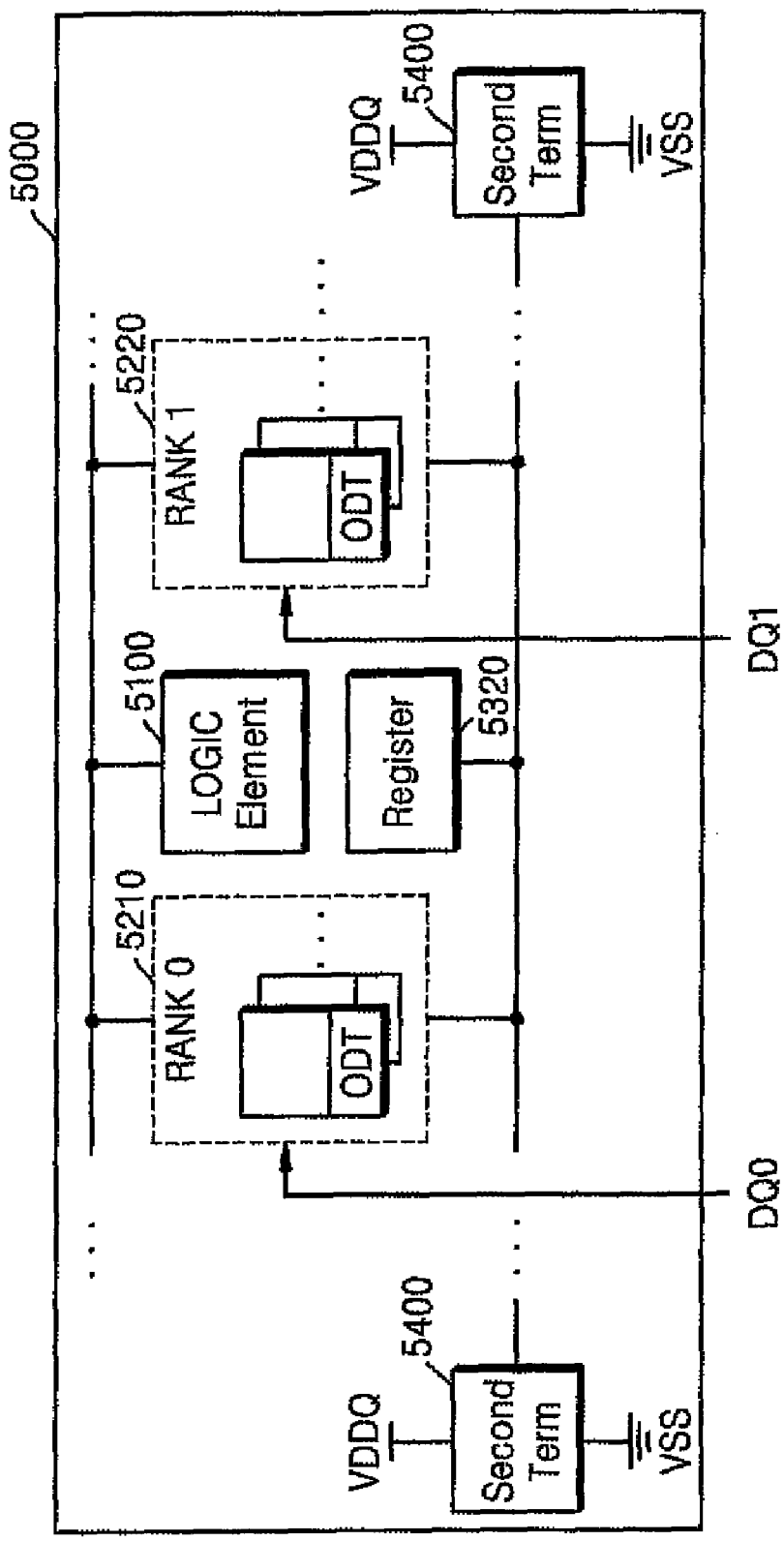
Figure 15C:
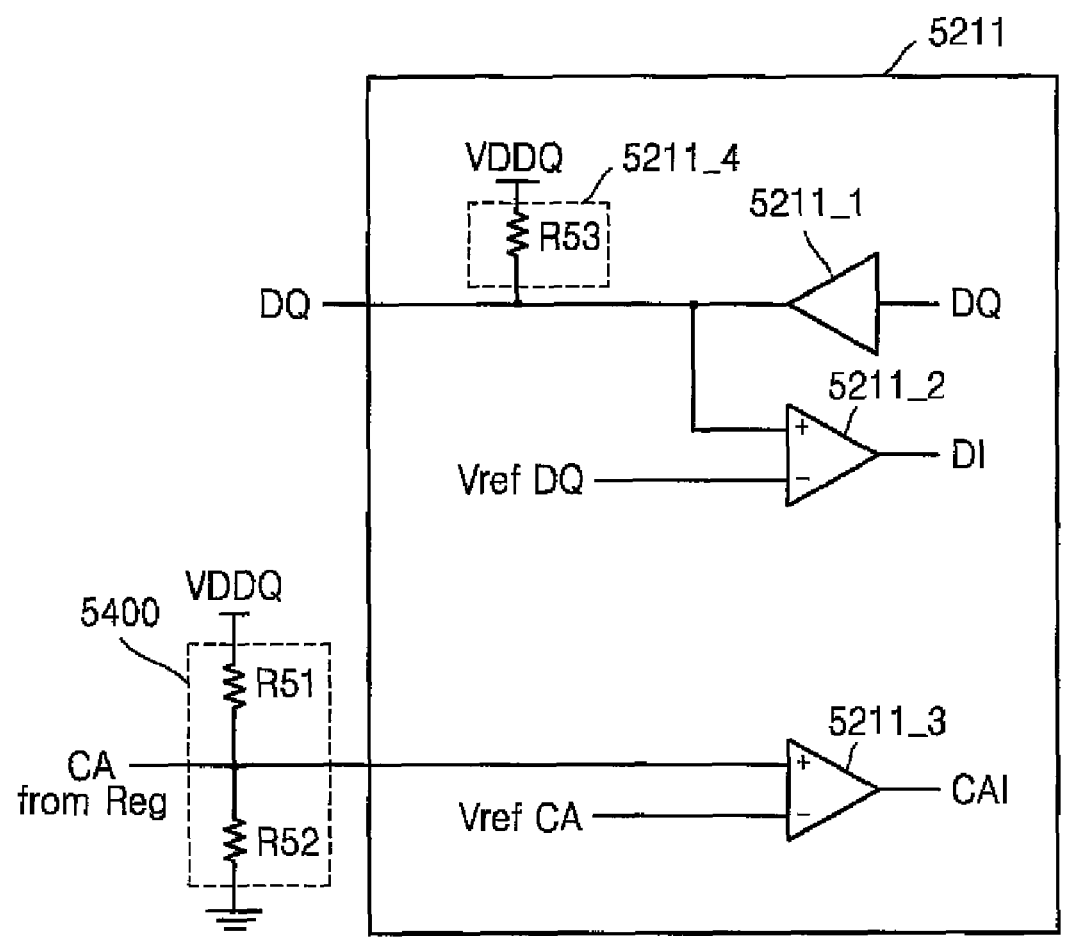
FIGS. 15C to 15E are circuit diagrams of representative memory devices of the memory module illustrated in FIG. 15A, according to illustrative embodiments.
Figure 15D:
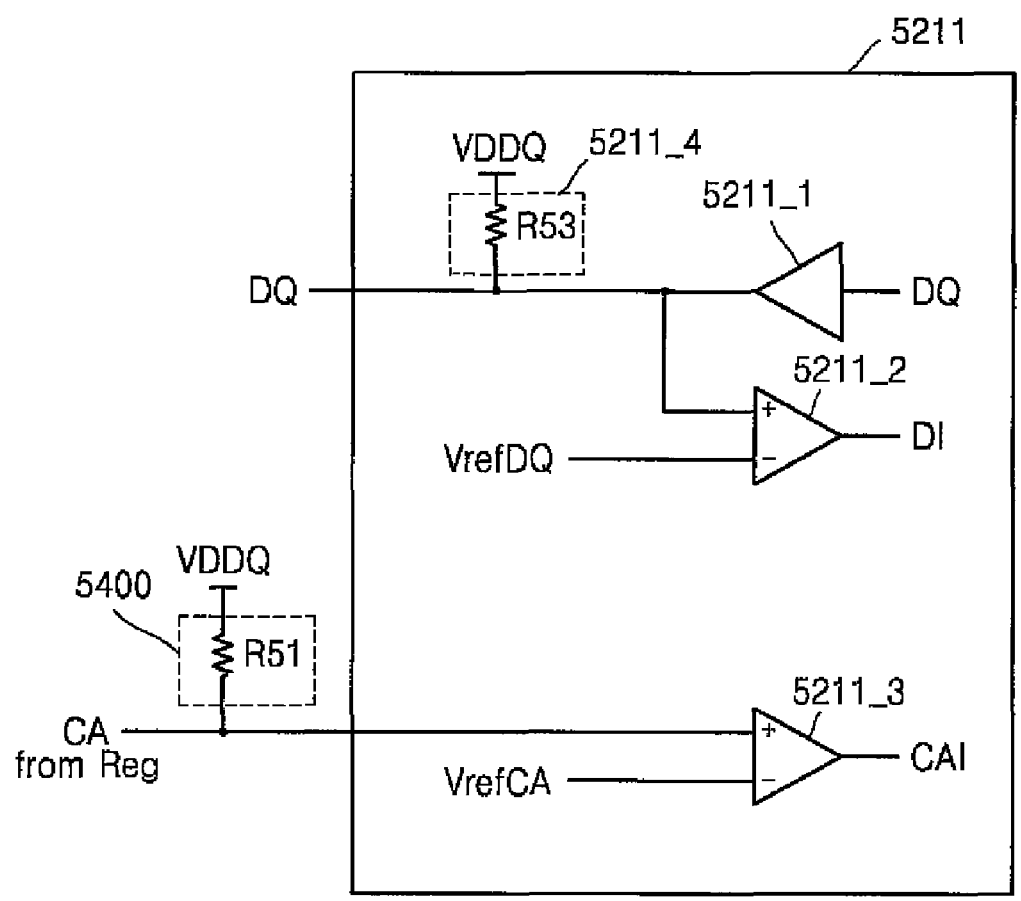
Figure 15E:
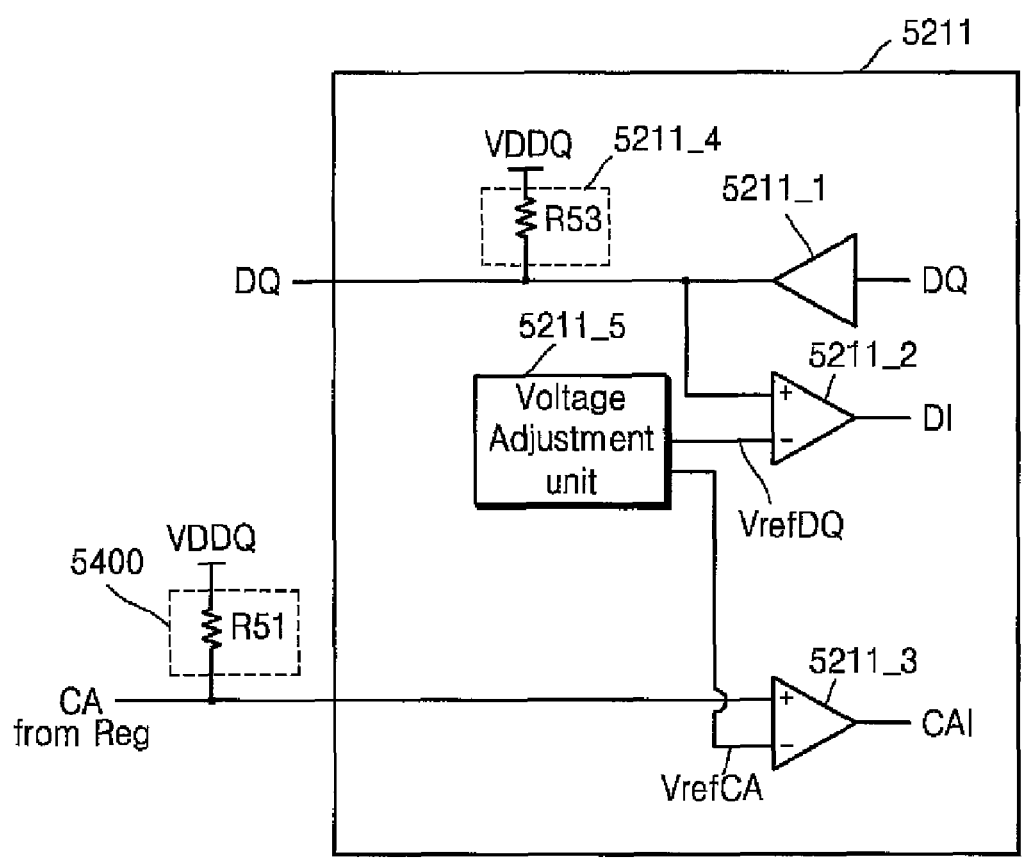

FIGS. 15A and 15B are block diagrams of a semiconductor memory module 5000, according to illustrative embodiments, and FIGS. 15C to 15E are circuit diagrams of representative memory devices of the memory module 500 illustrated in FIG. 15A, according to illustrative embodiments. Although FIGS. 15A to 15E illustrate the semiconductor memory module 5000, the semiconductor memory module 5000 may form a memory system together with an external host.

Referring to FIG. 15A, the memory module 5000 is a Load Reduced DIMM (LRDIMM), for example. In the memory module 5000, two or more semiconductor chips are grouped into one logical chip, as disclosed in U.S. Pat. No. 7,532,537, which is hereby incorporated by reference. The memory module 5000 includes a logic element 5100 and a memory unit 5200 that includes at least one memory device. The memory module 5000 may further include a phase-locked loop (PLL) 5310 for generating clock signals to be used in the memory module 5000, a register 5320 for storing signals received from a host (not shown), and a serial presence detect (SPD) device 5330 that includes a storage device. The memory module 5000 may further include a second termination resistor unit 5400 connected to a signal line disposed on a module board in order to deliver a command/address. The memory unit 5200 includes multiple ranks 5210, 5220, . . . , and each of the ranks 5210, 5220, . . . includes at least one semiconductor memory device. For example, the first rank RANK0 5210 includes at least one semiconductor memory device 5211, and the second rank RANK1 5220 includes at least one semiconductor memory device 5221. Each of the semiconductor memory devices 5211, 5221 includes a first termination resistor unit, which is an ODT resistor unit.

In the memory module 5000, the logic element 5100 generates at least one control signal for controlling the ranks 5210, 5220, . . . , of the memory unit 5200. The PLL 5310 generates at least one clock signal from a reference clock signal CLK_ref and provides the at least one clock signal to the logic element 5100, the memory unit 5200, and the register 5320. The register 5320 receives multiple commands/addresses from the host and buffers them. The commands/addresses are provided to the memory unit 5200 via the signal line disposed on the module board, and the second termination resistor unit 5400 is connected to the signal line.

The logic element 5100 receives input command and address signals CMD, BA, CS0, CS1, and An+1 from an external host, and generates output control signals CS0_1, CS0_2, CS1_1, and CS1_2 according to the input command and address signals CMD, BA, CS0, CS1, and An+1. The output control signals CS0_1, CS0_2, CS1_1, and CS1_2 may be generated in relation to the number of ranks 5210, 5220, . . . of the memory unit 5200. Also, the input command and address signals CMD, BA, CS0, CS1, and An+1 may be provided in relation to the number of ranks less than the total number of the multiple ranks 5210, 5220, . . . of the memory unit 5200. To this end, the logic element 5100 generates control signals related to the ranks 5210, 5220, . . . of the memory unit 5200 by using the input command and address signals CMD, BA, CS0, CS1, and An+1 received from the external host. For example, the logic element 5100 may generate control signals for activating or deactivating the ranks 5210, 5220, . . . of the memory unit 5200. That is, the external host determines that a number of ranks less than the actual total number of the ranks 5210, 5220, . . . included in the memory module 5000 are included in the memory module 5000. For example, even though the external host determines that the memory module 5000 includes $\alpha$ ranks and thus supplies selection signals CS0 and CS1 to the memory module 5000, the memory module 5000 actually includes $2*\alpha$ ranks and selection of the $2*\alpha$ ranks is controlled by the logic element 5100. The selection of the $2*\alpha$ ranks may be determined by the selection signals CS0 and CS1, an upper bit An+1 of an address, and/or a command CMD. Accordingly, it is possible to reduce the total number of signals to be supplied from the external host to the memory module 5000.

As described above, the memory module 5000 may include SPD device 5330. The SPD device 5330 may include a non-volatile memory, for example, EEPROM. The SPD device 5330 stores location information of the semiconductor memory devices 5211, 5221, . . . installed in the memory module 5000. For example, in the SPD device 5330, information regarding the semiconductor memory devices 5211, 5221, . . . installed in the memory module 5000, e.g., the total number of row and column addresses, data width, the total number of ranks, memory density of each of the ranks, the total number of the semiconductor memory devices 5211, 5221, . . . , and memory density of each of the semiconductor memory devices 5211, 5221, . . . , is recorded during design of a memory interface. If the memory system is initialized, information Module info of the memory module 5000 is supplied from the SPD device 5330 to an external controller (not shown).

FIG. 15B illustrates first termination resistor unit and the second termination resistor unit disposed on the memory module 5000 of FIG. 15A, according to an embodiment of the inventive concept. Referring to FIG. 15B, the memory module 5000 includes multiple ranks 5210, 5220, . . . , and each of the ranks 5210, 5220, . . . includes at least one memory device. The memory module 5000 may further include logic element 5100 and register 5320 disposed on a module board. The memory module 5000 may further include at least one second termination resistor unit 5400 connected to a signal path for delivering a command/address from the register 5320 to the ranks 5210, 5220, . . . . Data DQ0, DQ1, . . . may be supplied directly to the ranks 5210, 5220, . . . from an external host (not shown), or may be supplied to the ranks 5210, 5220, . . . via the register 5320. Each of the memory devices included in the respective ranks 5210, 5220, . . . may include at least one first termination register unit ODT, which is an ODT device connected to an input buffer (not shown) for receiving data.

FIGS. 15C, 15D and 15E are circuit diagrams illustrating portions of the memory module 5000 of FIGS. 15A and/or 15B, according to embodiments of the inventive concept. Referring to FIG. 15C, a semiconductor memory device 5211 is one of the at least one semiconductor memory device 5211 of the first rank RANK0 5210 of the memory module 5000. The memory device 5211 may include a data output buffer 5211_1, a data input buffer 5211_2, a command/address input buffer 5211_3, and a first termination resistor unit 5211_4.

The memory module 5000 may further include a second termination resistor unit 5400 disposed on a module board.

In the embodiment of FIG. 15C, the first termination resistor unit 5211_4 employs parallel termination type and the second termination resistor unit 5400 employs center tap termination type. The first termination resistor unit 5211_4 includes at least one resistor R53 connected between an input terminal, e.g., a (+) input terminal, of the data input buffer 5211_2 and a power supply voltage VDDQ source. The second termination resistor unit 5400 includes at least one resistor R51 connected between the power supply voltage VDDQ source and an input terminal, e.g., a (+) input terminal, of the command/address input buffer 5211_3, and at least one resistor R52 connected between a ground voltage VSS source and the input terminal, e.g., the (+) input terminal, of the command/address input buffer 5211_3.

As described above, if types of the first termination resistor unit 5211_4 and the second termination resistor unit 5400 are different each other, the signal swing characteristics of an input terminal, e.g., the (+) input terminal, of the data input buffer 5211_2 are different from those of an input terminal, e.g., the (+) input terminal, of the command/address input buffer 5211_3. Thus, a reference voltage for data VrefDQ and a reference voltage for command/address VrefCA are determined to be different from each other. Referring to FIG. 15C, since a signal swing level of an input terminal, e.g., the (+) input terminal, of the data input buffer 5211_2 is greater than that of an input terminal, e.g., the (+) input terminal, of the command/address input buffer 5211_3, the reference voltage for data VrefDQ is determined to be greater than the reference voltage for command/address VrefCA. As described above, the first termination resistor unit 5211_4 may be connected to a ground voltage VSS source rather than the power supply voltage VDDQ, in which case the reference voltage for data VrefDQ may be determined to be less than the reference voltage for command/address VrefCA.

FIG. 15D illustrates a configuration in which the first termination resistor unit 5211_4 and the second termination resistor unit 5400 have parallel termination types, according to an embodiment of the inventive concept. For example, referring to FIG. 15D, the first termination resistor unit 5211_4 includes a resistor R53 connected to a power supply voltage VDDQ source, and the second termination resistor unit 5400 includes a resistor R51 connected to the power supply voltage VDDQ source. A reference voltage for data VrefDQ may correspond to the signal swing characteristics of an input terminal, e.g., the (+) input terminal, of the data input buffer 5211_2. A reference voltage for command/address VrefCA may correspond to the signal swing characteristics of an input terminal, e.g., the (+) input terminal, of the command/address input buffer 5211_3. Referring to FIG. 15D, the reference voltage for data VrefDQ and the reference voltage for command/address VrefCA may be greater than voltage VDDQ/2, which is half the power supply voltage VDDQ. The first termination resistor unit 5211_4 and the second termination resistor unit 5400 may be connected to a ground voltage VSS source, in which case, the reference voltage for data VrefDQ and the reference voltage for command/address VrefCA may be less than the voltage VDDQ/2.

FIG. 15E illustrates a configuration in which the memory module 5000 includes a voltage adjustment unit 5211_5, according to an embodiment of the inventive concept. In particular, FIG. 15E illustrates a case where the voltage adjustment unit 5211_5 is included in each of the at least one semiconductor memory device 5211. Referring to FIG. 15E, the at least one memory device 5211 may include the voltage adjustment unit 5211_5, which generates a reference voltage for data VrefDQ and a reference voltage for command/address VrefCA from a predetermined reference voltage Vref. The reference voltage for data VrefDQ corresponds to the signal swing characteristics of an input terminal, e.g., the (+) input terminal, of a data input buffer 5211_2, and the reference voltage for command/address VrefCA corresponds to the signal swing characteristics of an input terminal, e.g., the (+) input terminal, of a command/address input buffer 5211_3. The reference voltage for data VrefDQ and/or the reference voltage for command/address VrefCA generated by the voltage adjustment unit 5211_5 included in each of the at least one semiconductor memory device 5211, may be different from the reference voltage for data VrefDQ and/or the reference voltage for command/address VrefCA generated by the voltage adjustment units 5211_5 included in other semiconductor memory devices (not shown).

Figure 16A:
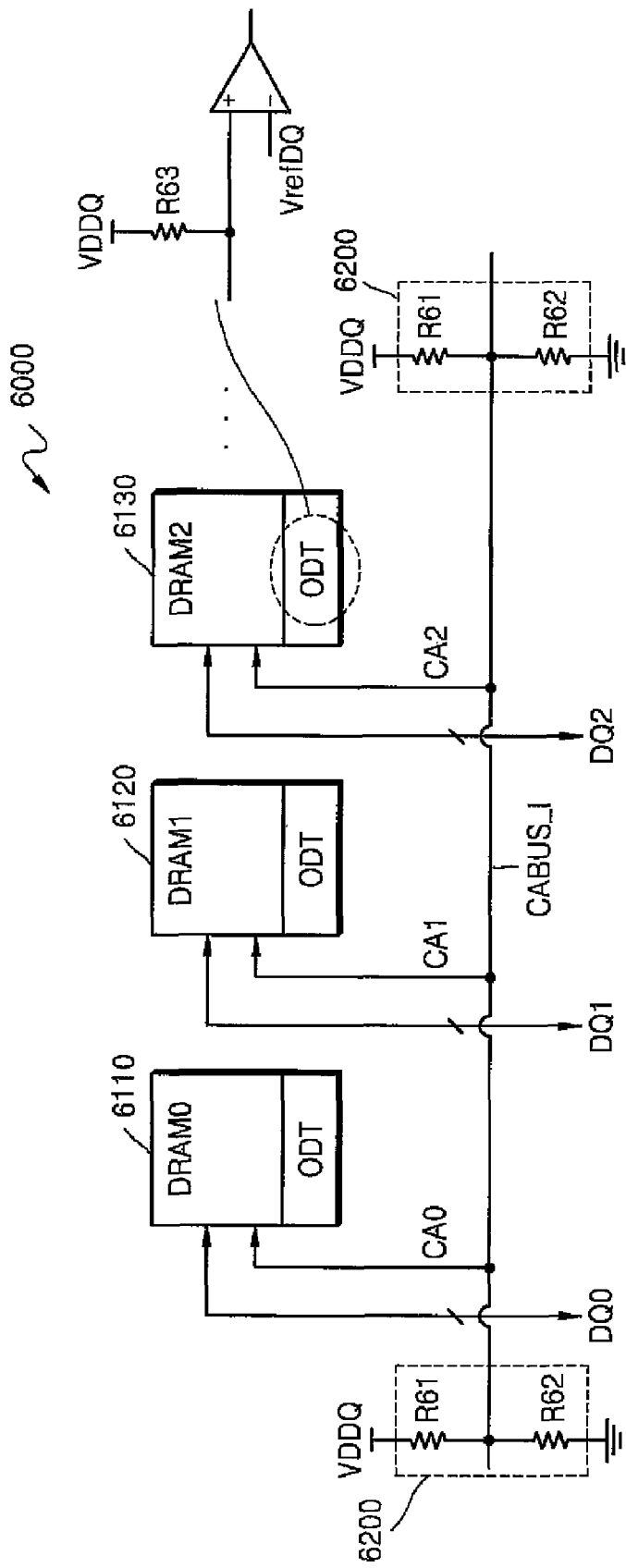
FIGS. 16A and 16B are block diagrams of semiconductor memory modules, according to illustrative embodiments.
Figure 16B:
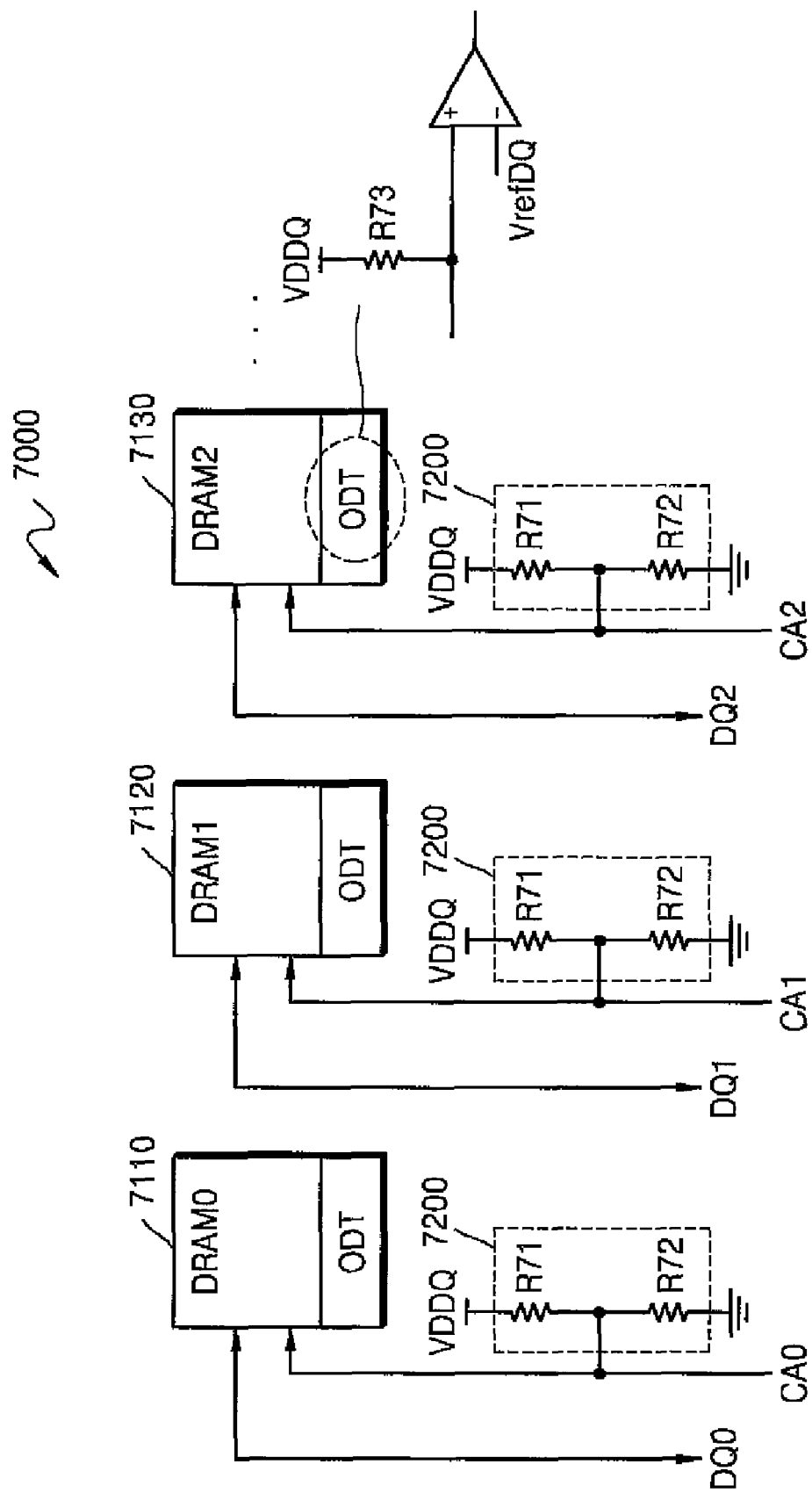

FIGS. 16A and 16B are block diagrams of semiconductor memory modules, according to embodiments the inventive concept. FIGS. 16A and 16B illustrate memory modules 6000 and 7000, which may are UDIMMs, for example, each including first termination resistor unit and second termination resistor unit. Although not shown in FIGS. 16A and 16B, the first termination resistor unit and the second termination resistor unit can also be applied to other types of memory modules by adding additional semiconductor devices into the memory modules 6000 and 7000 illustrated in FIGS. 16A and 16B.

Referring to FIG. 16A, the memory module 6000 includes multiple semiconductor memory devices 6110, 6120, 6130, . . . . Each of the memory devices 6110, 6120, 6130, . . . includes a first termination resistor unit ODT, which is an ODT device. An internal command/address bus CABUS_I is disposed on a module board of the memory module 6000 to supply commands/addresses CA0, CA1, CA2, . . . to the semiconductor memory devices 6110, 6120, 6130, . . . , respectively. The internal command/address bus CABUS_I is connected to the at least one second termination resistor unit 6200. Referring to FIG. 16A, each of the first termination resistor units ODT employs parallel termination and the second termination resistor unit 6200 employs center tap termination. For example, each of the first termination resistor units ODT may includes at least one resistor R63 connected to a power supply voltage VDDQ source, and the at least one second termination resistor unit 6200 may include at least one resistor R61 connected between the power supply voltage VDDQ source and the internal command/address bus CABUS_I and at least one resistor R62 connected between a ground voltage VSS source and the internal command/address bus CABUS_I.

In this case, as described above, a reference voltage for data VrefDQ is determined to be different from a reference voltage for command/address (not shown). Referring to FIG. 16A, the reference voltage for data VrefDQ may be greater than the reference voltage for command/address. For example, the reference voltage for data VrefDQ may range between the power supply voltage VDDQ and the reference voltage for command/address. Also, as described above, in various configurations, each of the first termination resistor units ODT may be connected to the ground voltage VSS source rather than the power supply voltage VDDQ source, and the at least one second termination resistor unit 6200 may employ parallel termination rather than center tap termination. If the types of the first termination resistor units ODT and the at least one second termination resistor unit 6200 are changed, then the reference voltage for data VrefDQ and the reference voltage for command/address may also be changed.

Referring to FIG. 16B, in the semiconductor memory module 7000, commands/addresses CA0, CA1, CA2, . . . are supplied to multiple semiconductor memory devices 7110, 7120, 7130, . . . from a host (not shown). Each of the semiconductor memory devices 7110, 7120, 7130, . . . includes a first termination resistor unit ODT, which is an ODT device. Multiple second termination resistor units 7200 are connected to a command/address bus for supplying commands/addresses CA0, CA1, CA2, . . . to the semiconductor memory devices 7110, 7120, 7130, . . . , respectively. Also, each of the first termination resistor units ODT includes at least one resistor R73 connected to a power supply voltage VDDQ source, and each of the second termination resistor units 7200 includes at least one resistor R71 connected between the power supply voltage VDDQ source and the command/address bus and at least one resistor R72 connected between a ground voltage VSS source and the command/address bus. In the embodiment of FIG. 16B, a reference voltage for data VrefDQ may be greater than a reference voltage for command/address (not shown). Also, as described above, the first termination resistor units ODT may be connected to the ground voltage VSS source rather than the power supply voltage VDDQ source, and the second termination resistor units 7200 may employ parallel termination rather than center tap termination. If the types of the first termination resistor unit and the second termination resistor unit 7200 are changed, then the reference voltage for data VrefDQ and the reference voltage for command/address may also be changed.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A semiconductor memory module comprising:
a memory module board comprising at least one semiconductor memory device, wherein the at least one semiconductor memory device comprises:
a data input buffer for receiving data via a first input terminal and receiving a first reference voltage via a second input terminal;
a command/address input buffer for receiving a command/address signal via a first input terminal and receiving a second reference voltage via a second input terminal; and
a first termination resistor unit connected to the first input terminal of the data input buffer;
an advanced memory buffer (AMB) for receiving the data and the command/address signal from a host and providing the data and the command/address signal to the at least one semiconductor memory device; and
a second termination resistor unit located on the memory module board and electrically connected to the AMB,
wherein the first termination resistor unit comprises a first resistor connected between a first voltage source and the first input terminal of the data input buffer, the first termination resistor unit for applying a first voltage from the first voltage source to the first input terminal of the data input buffer, and
the second termination resistor unit comprises a second resistor connected between a second voltage source and the first input terminal of the command/address input buffer, and a third resistor connected between a third voltage source and the first input terminal of the command/address input buffer, the second voltage source supplying a second voltage and the third voltage source supplying a third voltage.

2. The semiconductor memory module of claim 1, wherein the first voltage is a power supply voltage.

3. The semiconductor memory module of claim 2, wherein the second voltage is the power supply voltage, and the third voltage is a ground voltage.

4. The semiconductor memory module of claim 1, wherein the first voltage is a ground voltage.

5. The semiconductor memory module of claim 4, wherein the second voltage is the power supply voltage, and the third voltage is a ground voltage.

6. The semiconductor memory module of claim 1, wherein the first input terminal of the data input buffer has a first signal swing level based on a first termination type of the first termination resistor unit, and the first input terminal of the command/address input buffer has a second signal swing level based on a second termination type of the second termination resistor unit,
wherein the first reference voltage has a first level corresponding to the first signal swing level, and the second reference voltage has a second level corresponding to the second signal swing level, and
wherein at least one of the first and second reference voltages is obtained by performing calibration based on at least one of the first and second termination types.

7. The semiconductor memory module of claim 6, wherein each of the at least one semiconductor memory device further comprises a voltage adjustment unit for receiving a predetermined voltage and generating the first reference voltage and the second reference voltage from the predetermined voltage.

8. The semiconductor memory module of claim 7, wherein a first voltage adjustment unit included in a first semiconductor memory device and a second voltage adjustment unit included in a second semiconductor memory device perform calibration independently of each other, such that at least one of the first and second levels of the first and second reference voltages generated in the first voltage adjustment unit is different from at least one of the first and second levels of the first and second reference voltages generated in the second voltage adjustment unit.

9. A semiconductor memory module comprising:
a memory module board comprising at least one semiconductor memory device including a plurality of memory ranks, wherein the at least one semiconductor memory device comprises:
a data input buffer for receiving data via a first input terminal and receiving a first reference voltage via a second input terminal;
a command/address input buffer for receiving a command/address signal via a first input terminal and receiving a second reference voltage via a second input terminal; and
a first termination resistor unit connected to the first input terminal of the data input buffer;
a logic element for receiving information from a host and generating a control signal for controlling a selection of the plurality of memory ranks;
a register for receiving the data and the command/address signal from the host and providing the data and the command/address signal to the at least one semiconductor memory device; and
a second termination resistor unit located on the memory module board and electrically connected to the register,
wherein the first termination resistor unit comprises a first resistor connected between a first voltage source and the first input terminal of the data input buffer, the first termination resistor unit for applying a first voltage from the first voltage source to the first input terminal of the data input buffer, and the second termination resistor unit comprises a second resistor connected between a second voltage source and the first input terminal of the command/address input buffer, and a third resistor connected between a third voltage source and the first input terminal of the command/address input buffer, the second voltage source supplying a second voltage and the third voltage source supplying a third voltage.

10. The semiconductor memory module of claim 9, wherein the first voltage is a power supply voltage.

11. The semiconductor memory module of claim 10, wherein the second voltage is the power supply voltage, and the third voltage is a ground voltage.

12. The semiconductor memory module of claim 9, wherein the first voltage is a ground voltage.

13. The semiconductor memory module of claim 12, wherein the second voltage is the power supply voltage, and the third voltage is a ground voltage.

14. The semiconductor memory module of claim 9, wherein the first input terminal of the data input buffer has a first signal swing level based on a first termination type of the first termination resistor unit, and the first input terminal of the command/address input buffer has a second signal swing level based on a second termination type of the second termination resistor unit, wherein the first reference voltage has a first, level corresponding to the first signal swing level, and the second reference voltage has a second level corresponding to the second signal swing level, and wherein at least one of the first and second reference voltages is obtained by performing calibration based on at least one of the first termination type and the second termination type.

15. The semiconductor memory module of claim 14, wherein each of the at least one semiconductor memory device further comprises a voltage adjustment unit for receiving a predetermined voltage and generating the first reference voltage and the second reference voltage from the predetermined voltage.

16. The semiconductor memory module of claim 15, wherein a first voltage adjustment unit included in a first semiconductor memory device and a second voltage adjustment unit included in a second semiconductor memory device perform calibration independently of each other, such that at least one of the first and second levels of the first and second reference voltages generated in the first voltage adjustment unit is different from at least one of the first and second levels of the first and second reference voltages generated in the second voltage adjustment unit.

17. A semiconductor memory module comprising:
a memory module board comprising at least two semiconductor memory devices, wherein each of the at least two semiconductor memory devices comprises:
a data input buffer for receiving data via a first input terminal and receiving a first reference voltage via a second input terminal;
a command/address input buffer for receiving a command/address signal via a first input terminal and receiving a second reference voltage via a second input terminal; and
a first termination resistor unit connected to the first input terminal of the data input buffer;
an advanced memory buffer (AMB) for receiving the data and the command/address signal from a host and providing the data and the command/address signal to the at least one semiconductor memory device; and
a second termination resistor unit located on the memory module board and electrically connected to the AMB,
wherein the first termination resistor unit comprises a first resistor connected between a first voltage source and the first input terminal of the data input buffer, the first termination resistor unit for applying a first voltage from the first voltage source to the first input terminal of the data input buffer, and
the second termination resistor unit comprises a second resistor connected between a second voltage source and the first input terminal of the command/address input buffer, the second resistor for applying a second voltage from the second voltage source to the first input terminal of the command/address input buffer.

18. The semiconductor memory module of claim 17, wherein each of the first voltage and the second voltage is equal to a power supply voltage.

19. The semiconductor memory module of claim 17, wherein each of the first voltage and the second voltage is equal to a ground voltage.

20. A semiconductor memory module comprising:
a memory module board comprising at least two semiconductor memory devices including a plurality of memory ranks, wherein each of the at least two semiconductor memory devices comprises:
a data input buffer for receiving data via a first input terminal and receiving a first reference voltage via a second input terminal;
a command/address input buffer for receiving a command/address signal via a first input terminal and receiving a second reference voltage via a second input terminal; and
a first termination resistor unit connected to the first input terminal of the data input buffer;
a logic element for receiving information from a host and generating a control signal for controlling a selection of the plurality of memory ranks;
a register for receiving the data and the command/address signal from the host and providing the data and the command/address signal to the at least two semiconductor memory devices; and
a second termination resistor unit located on the memory module board and electrically connected to the register,
wherein the first termination resistor unit comprises a first resistor connected between a first voltage source and the first input terminal of the data input buffer, the first termination resistor unit for applying a first voltage from the first voltage source to the first input terminal of the data input buffer, and
wherein the second termination resistor unit comprises a second resistor connected between a second voltage source and the first input terminal of the command/address input buffer, the second resistor for applying a second voltage from the second voltage source to the first input terminal of the command/address input buffer.

21. The semiconductor memory module of claim 20, wherein each of the first voltage and the second voltage is equal to a power supply voltage.

22. The semiconductor memory module of claim 20, wherein each of the first voltage and the second voltage is equal to a ground voltage.

23. A semiconductor memory module comprising:
a memory module board comprising at least one semiconductor memory device, wherein the at least one semiconductor memory device comprises:
- a data input buffer for receiving data via a first input terminal and receiving a first reference voltage via a second input terminal;
- a command/address input buffer for receiving a command/address signal via a first input terminal and receiving a second reference voltage via a second input terminal; and
- a first termination resistor unit connected to the first input terminal of the data input buffer;

at least one command/address bus, each of the at least one command/address bus receiving the command/address signal from a host and providing the command/address signal to the corresponding semiconductor memory device; and at least one second termination resistor unit located on the memory module board, each of the at least one second termination resistor unit connected to the corresponding command/address bus, wherein the first termination resistor unit comprises a first resistor connected between a first voltage source and the first input terminal of the data input buffer, the first termination resistor unit for applying a first voltage from the first voltage source to the first input terminal of the data input buffer, and wherein the second termination resistor unit comprises a second resistor connected between a second voltage source and the first input terminal of the command/address input buffer, and a third resistor connected between a third voltage source and the first input terminal of the command/address input buffer.

* * * * *